(12) United States Patent
Miura et al.

(10) Patent No.: US 10,901,036 B2
(45) Date of Patent: Jan. 26, 2021

(54) ASSEMBLED BATTERY MONITORING SYSTEM

(71) Applicant: DENSO CORPORATION, Kariya (JP)

(72) Inventors: Ryotaro Miura, Kariya (JP); Yukihiro Tomonaga, Kariya (JP)

(73) Assignee: DENSO CORPORATION, Kariya (JP)

( * ) Notice: Subject to any disclaimer, the term of this patent is extended or adjusted under 35 U.S.C. 154(b) by 281 days.

(21) Appl. No.: 16/171,461

(22) Filed: Oct. 26, 2018

(65) Prior Publication Data

US 2019/0064272 A1 Feb. 28, 2019

Related U.S. Application Data

(63) Continuation of application No. PCT/JP2017/008101, filed on Mar. 1, 2017.

(30) Foreign Application Priority Data

May 16, 2016 (JP) .................................. 2016-97918

(51) Int. Cl.
*G01R 31/327* (2006.01)
*H01M 10/42* (2006.01)
(Continued)

(52) U.S. Cl.
CPC ....... *G01R 31/3277* (2013.01); *G01R 19/165* (2013.01); *G01R 31/364* (2019.01);
(Continued)

(58) Field of Classification Search
CPC .......... G01R 31/3277; G01R 19/16542; G01R 31/396; G01R 31/364; G01R 19/165;
(Continued)

(56) References Cited

U.S. PATENT DOCUMENTS 9,035,611 B2   5/2015  Kikuchi et al.
9,488,696 B2 * 11/2016  Matsumoto ............. B60L 58/22
(Continued)

FOREIGN PATENT DOCUMENTS

JP    2014-090536 A   5/2014
JP    2014-102127 A   6/2014

*Primary Examiner* — Daniel R Miller
(74) *Attorney, Agent, or Firm* — Posz Law Group, PLC

(57) ABSTRACT

In an assembled battery monitoring system, a voltage monitoring apparatus monitors voltages of battery cells of an assembled battery. Discharging resistance elements and RC filters are correspondingly coupled between the battery cells and the voltage monitoring apparatus. Discharging switches are disposed inside of the voltage monitoring apparatus correspondingly to the battery cells. The discharging resistance elements are each disposed on a discharging path at a position that prohibits discharging of charges stored in a capacitor of the corresponding RC filter. A fault diagnosis device simultaneously turns on two discharging switches, which are apart from each other across at least two discharging switches, and determines that any of the discharging switches between the two discharging switches simultaneously turned on has a fault, when a terminal voltage of any of the battery cells that are located between the two discharging switches simultaneously turned on changes over a predetermined voltage.

10 Claims, 25 Drawing Sheets

(51) Int. Cl.
*G01R 31/396* (2019.01)
*H01M 10/48* (2006.01)
*H01M 10/44* (2006.01)
*G01R 19/165* (2006.01)
*G01R 31/364* (2019.01)
*H02J 7/00* (2006.01)
*B60L 58/22* (2019.01)

(52) U.S. Cl.
CPC ........ *G01R 31/396* (2019.01); *H01M 10/425* (2013.01); *H01M 10/441* (2013.01); *H01M 10/48* (2013.01); *H01M 10/482* (2013.01); *H02J 7/0016* (2013.01); *H02J 7/0021* (2013.01); *B60L 58/22* (2019.02); *G01R 19/16542* (2013.01); *H01M 2010/4271* (2013.01)

(58) Field of Classification Search
CPC .. H01M 10/425; H01M 10/48; H01M 10/441; H01M 10/482; H01M 2010/4271; H01M 10/44; H01M 10/4257; H01M 10/4264; H01M 10/4285; H02J 7/0016; H02J 7/0021; H02J 7/0014; H02J 7/0019; Y02E 60/10; B60L 58/22
See application file for complete search history.

(56) References Cited

U.S. PATENT DOCUMENTS

| | | |
|---|---|---|
| 2009/0079396 A1 | 3/2009 | Osamura |
| 2010/0209748 A1* | 8/2010 | Kudo ................... H01M 10/482 429/91 |
| 2012/0025769 A1* | 2/2012 | Kikuchi ................ B60R 16/033 320/118 |
| 2012/0146652 A1 | 6/2012 | Aoki et al. |
| 2014/0266050 A1* | 9/2014 | Biskup .................. H02J 7/0016 320/118 |
| 2015/0162759 A1 | 6/2015 | Fujii et al. |
| 2016/0061909 A1* | 3/2016 | Iino ...................... G01R 31/396 324/432 |
| 2016/0159243 A1* | 6/2016 | Park ...................... B60L 3/0046 320/136 |

* cited by examiner

US 10,901,036 B2

ASSEMBLED BATTERY MONITORING SYSTEM

CROSS REFERENCE TO RELATED APPLICATIONS

The present application is a continuation application of International Patent Application No. PCT/JP2017/008101 filed on Mar. 1, 2017, which designated the U.S. and claims the benefit of priority from Japanese Patent Application No. 2016-97918 filed on May 16, 2016. The entire disclosures of all of the above applications are incorporated herein by reference.

TECHNICAL FIELD

The present disclosure relates to an assembled battery monitoring system that monitors a voltage of each of battery cells of an assembled battery.

BACKGROUND

A voltage monitoring apparatus is coupled to an assembled battery for detecting a voltage of each of battery cells and performing an equalizing processing for equalizing voltages of the battery cells.

SUMMARY

The present disclosure provides an assembled battery monitoring system that monitors a voltage of each of a plurality of battery cells of an assembled battery. The assembled battery monitoring system also determines a fault of any discharging switches, which are correspondingly provided for the battery cells, by simultaneously turning on pairs of discharging switches, each pair of the discharging switches being apart from each other across at least two discharging switches, and by determining whether a terminal voltage of the battery cell corresponding to any of the discharging switches located between any pair of the discharging switches changes over a predetermined voltage.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
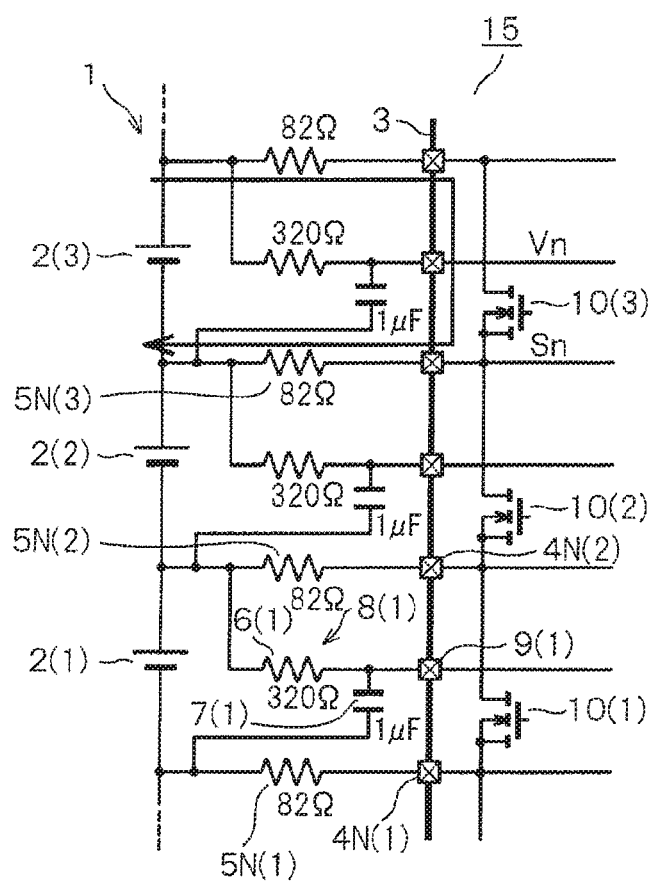
FIG. 1 is a circuit diagram illustrating a part of an assembled battery monitoring system of a first reference example.

An assembled battery monitoring system has a voltage monitoring apparatus coupled to an assembled battery for detecting a voltage of each of battery cells and performing an equalizing processing for equalizing voltages of the battery cells. An RC filter for removing noise is disposed between the assembled battery and the voltage monitoring apparatus. There are various types of RC filters coupled in various ways. One of the RC filters is a so-called independent-type filter. The independent-type filter has a resistance element for discharging; separately from a resistance element constituting the RC filter, and both ends of a capacitor constituting the RC filter are not directly coupled to ends of capacitors of RC filters for adjacent battery cells.

Such an independent-type filter has less variations in cutoff frequency for each of battery cells, and has a noise reduction performance higher than that of a non-independent-type filter. Further, the independent-type filter has a high resistance to vibrations due to differential oscillation, as compared with an earthed-type filter in which an opposite end of a filter capacitor is grounded.

In an assembled battery monitoring system utilizing an independent-type filter, however, charges of filter capacitors are discharged when battery cells are discharged in an equalizing processing. Therefore, it is difficult to shift to a next processing, such as voltage detection; until the filter capacitor is charged again. As a result, a time for processing is likely to be elongated in total. Also, it is necessary to rearrange a time schedule for each processing, when a time constant of the RC filter is changed.

In an embodiment of the present disclosure, an assembled battery monitoring system includes: a voltage monitoring apparatus configured to monitor a voltage of each of a plurality of battery cells of an assembled battery, the plurality of battery cells being coupled in series and in a plurality of stages; a plurality of discharging resistance elements and a plurality of RC filters that are correspondingly coupled between the plurality of battery cells and the voltage monitoring apparatus; a plurality of discharging switches disposed inside of the voltage monitoring apparatus and correspondingly to the plurality of the battery cells, and configured to discharge the corresponding battery cells; and a fault diagnosis device configured to control on and off of each of the discharging switches so as to perform a fault diagnosis of each of the discharging switches. The voltage monitoring apparatus has at least three connection terminals for each of the plurality of battery cells. Two of the at least three connection terminals are configured to be used to monitor a voltage of a corresponding battery cell through an output terminal of a corresponding RC filter. At least one of a remainder of the at least three connection terminals is configured to be used to form a discharging path of the corresponding battery cell when a corresponding discharging switch is turned on. Each of the discharging resistance elements is disposed on the discharging path at a position that prohibits discharging of charges stored in a capacitor of the corresponding RC filter. Further, the fault diagnosis device is configured to simultaneously turn on pairs of two discharging switches, which are apart from each other across at least two discharging switches, and to determine that any of the discharging switches located between any pair of the discharging switches has a fault, when a terminal voltage of any of the battery cells that are located between the pair of the discharging switches has a change over a predetermined voltage relative to the terminal voltage of the battery cell in an off state.

In such an embodiment, the fault of the discharging switches can be determined by monitoring the change in voltage of the battery cells when the existing discharging switches are turned on, without requiring another circuit element.

Hereinafter, reference examples and embodiments of the present disclosure will be described more in detail.

First Reference Example

Hereinafter, a first reference example will be described. As shown in FIG. 1, an assembled battery 1 includes a plurality of battery cells 2 (1, 2, 3, . . . ) which are secondary cells and are coupled in series in multiple stages. In the following descriptions and in the drawings, when a battery cell 2 on a specific stage is referred to, the number of the stage is indicated in a rounded bracket after the reference number "2" of the battery cell. For example, the battery cell 2 on the first stage is indicated as "battery cell 2(1)". This indication is similar to other components, and the number of the corresponding stage is indicated in a rounded bracket after the reference number of the component. For example, a discharging switch 10(1) denotes a discharging switch 10 that is provided to correspond to the battery cell 2(1) on the first stage. A voltage monitoring IC 3 has connection terminals 4N to correspond to negative terminals of respective battery cells 2. The connection terminals 4N are correspondingly coupled to the negative terminals of the battery cells 2 through discharging resistance elements 5N. The voltage monitoring IC 3 corresponds to a voltage monitoring apparatus.

For example, a positive terminal of the battery cell 2(1) is shared with a negative terminal of the battery cell 2(2) on a higher stage, that is, on a higher voltage side of the battery cell 2(1). Thus, assumed that a connection terminal corresponding to the positive terminal of the battery cell 2 is referred to as a connection terminal 4P, a connection terminal 4P(1) can be a connection terminal 4N(2). Hereinafter, a terminal coupled to a positive end of any battery cell 2 will be also referred to as a terminal 4N(+), and a terminal coupled to a negative end of any battery cell 2 will be also referred to as a terminal 4N(−), irrespective of the stage of the battery cell 2.

A series circuit of a resistance element 6 and a capacitor 7 is coupled to the positive terminal and the negative terminal of each battery cell 2. The series circuit of the resistance element 6 and the capacitor 7 provides an RC filter 8. In the voltage monitoring IC 3, a filter connection terminal 9 is provided between the connection terminals 4 that correspond to each battery cell 2. An output terminal of the RC filter 8, which is a common connection point between the resistance element 6 and the capacitor 7, is coupled to the filter connection terminal 9. A discharging switch 10 is made of an N-channel MOSFET. The discharging switch 10 is coupled between the connection terminals 4N corresponding to each battery cell 2 inside of the voltage monitoring IC 3. As an example, the discharging resistance element 5N has a resistance value of 82Ω, the resistance element 6 has a resistance value of 320Ω, and the capacitor 7 has a capacitance of approximately 1 μF.

Figure 2:
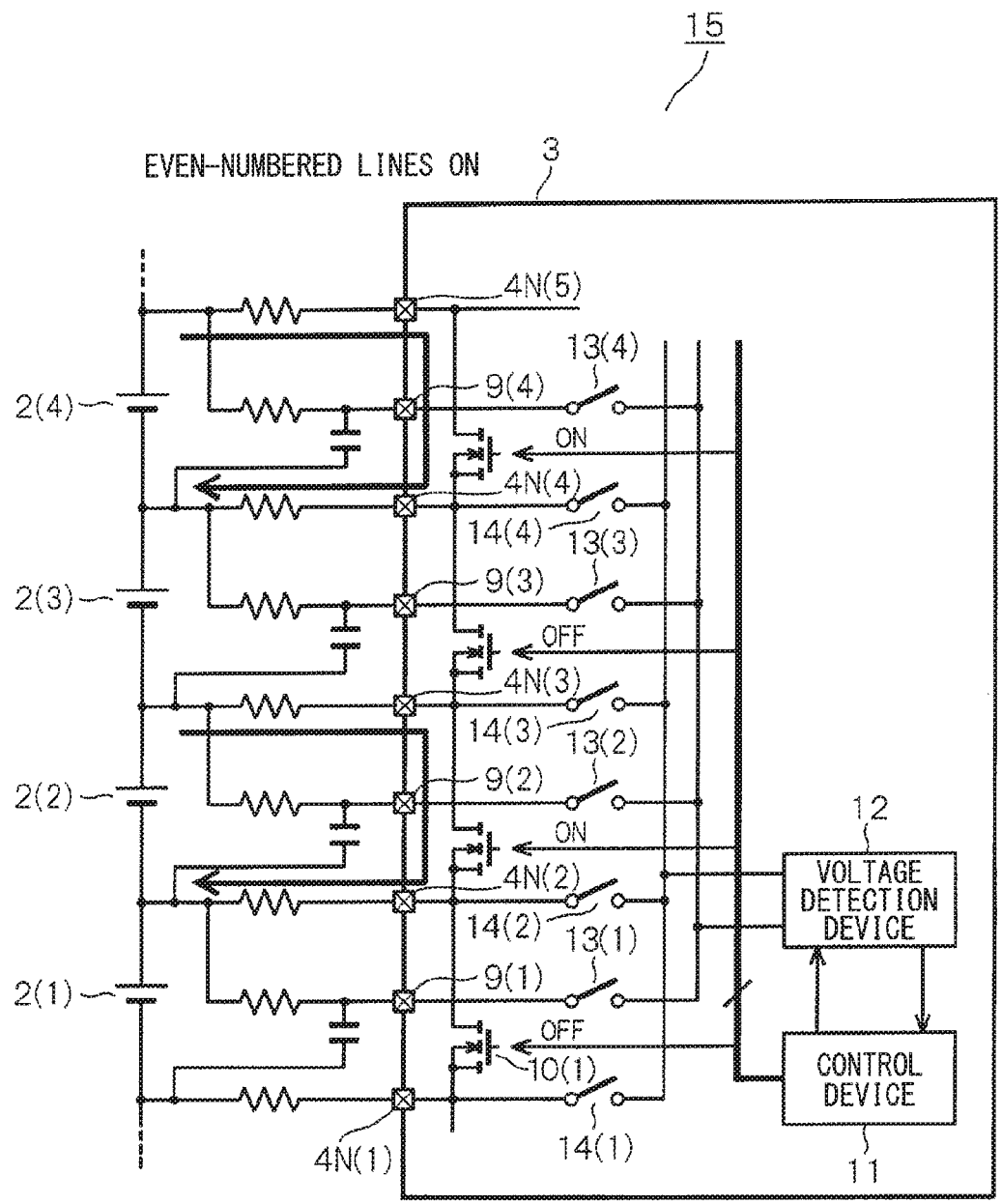
FIG. 2 is a diagram illustrating an entire structure of the assembled battery monitoring system in a state where even-numbered battery cells are discharged.

As shown in FIG. 2, the voltage monitoring IC 3 has a control device 11 and a voltage detection device 12. The filter connection terminal 9 and the connection terminals 4N, which correspond to each battery cell 2, are commonly coupled to respective input terminals of the voltage detection device 12 via a switch 13 and switches 14, respectively. The control device 11 controls on and off of the switches 13 and 14 to enable the voltage detection device 12 to detect the voltage of each of battery cells 2 independently. The detection results of the voltage detection device 12 are provided to the control device 11. The control device 11 controls on and off of the discharging switches 10 so as to perform an equalizing processing of the respective battery cells 2. An assembled battery monitoring system 15 is configured as described above. Note that the discharging switch 10 is also indicated as "equalization switch", in the drawings.

Figure 3:
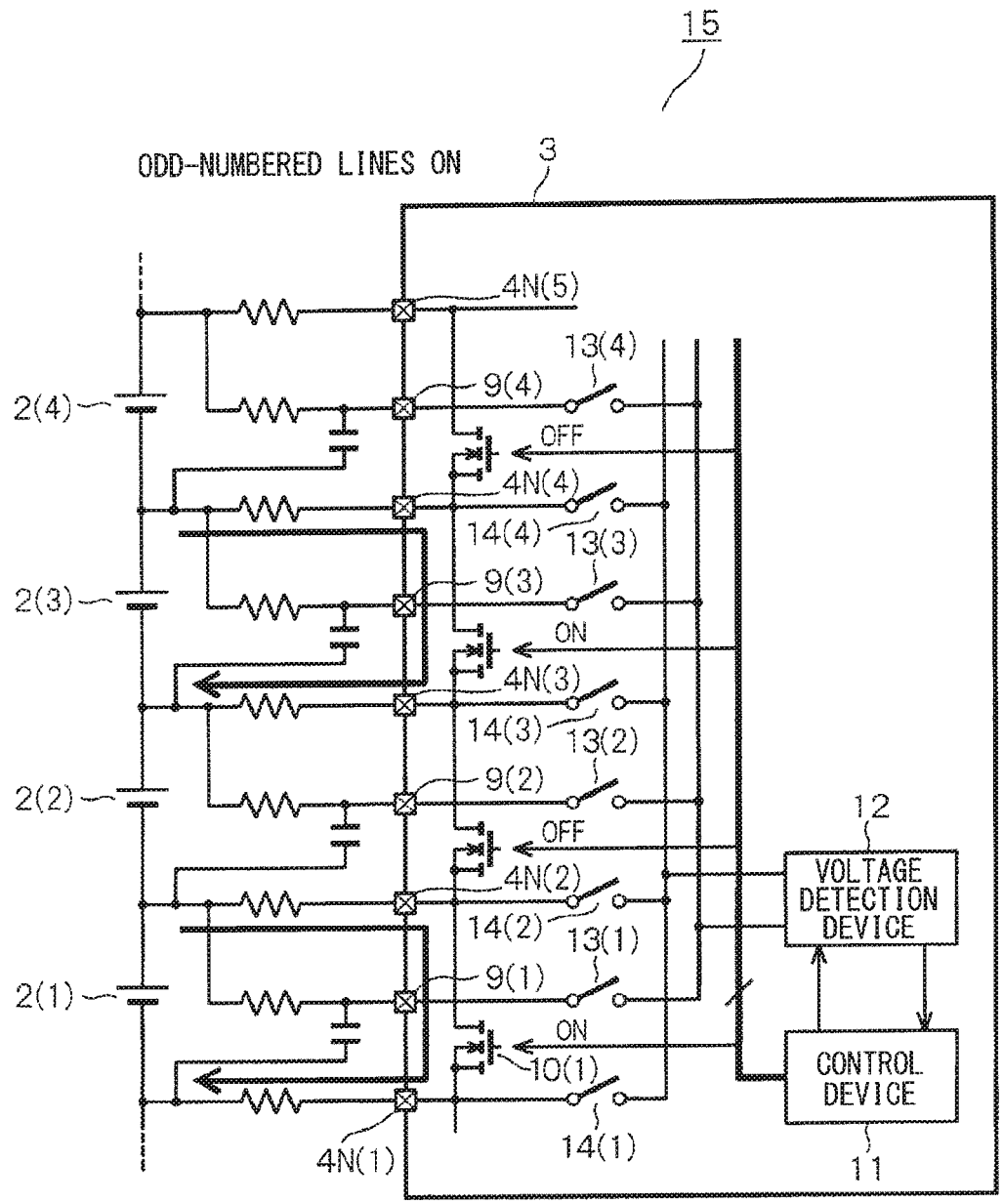
FIG. 3 is a diagram illustrating the entire structure of the assembled battery monitoring system in a state where odd-numbered battery cells are discharged.
Figure 4:
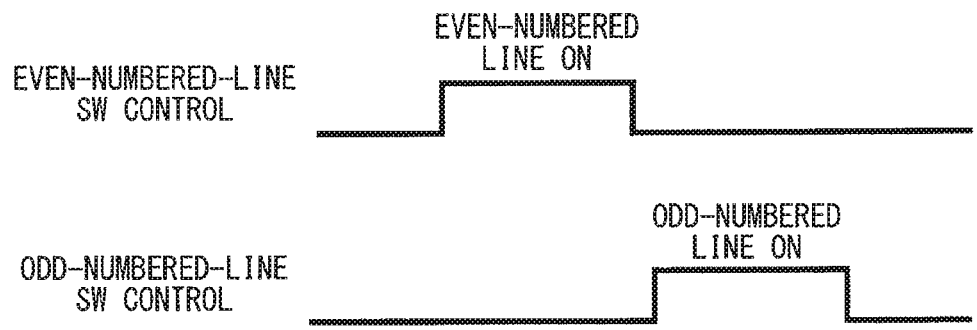
FIG. 4 is a diagram illustrating a time chart of a control of a case where discharging of each of the even-numbered battery cells and the odd-numbered battery cells is performed collectively.
Figure 5:
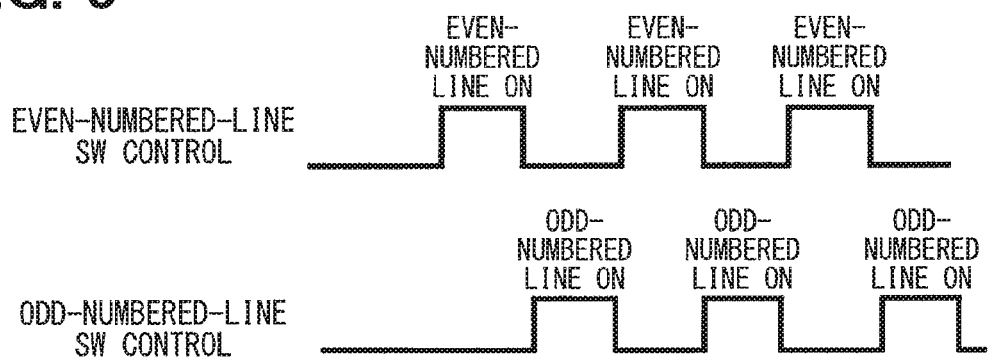
FIG. 5 is a diagram illustrating a time chart of a control of a case where discharging of each of the even-numbered battery cells and the odd-numbered battery cells performed separately in several times.

In the configuration of the present reference example, the equalizing processing is performed in a following manner, for example. It is preferable that the switches are controlled in such a manner that discharging of even-numbered battery cells 2(2) and 2(4), which are on even-numbered stages, is performed as shown in FIG. 2, and then discharging of odd-numbered battery cells 2(1) and 2(3), which are on odd-numbered stages, is performed as shown in FIG. 3. In this case, therefore, a discharge current is suppressed, and heat generation is suppressed. In such a case, each of the discharging of the even-numbered battery cells 2(2) and 2(4) and the discharging of the odd-numbered battery cells 2(1) and 2(3) may be performed collectively, i.e., simultaneously, as shown in FIG. 4. Alternatively, each of the discharging of the even-numbered battery cells 2(2) and 2(4) and the discharging of the odd-numbered battery cells 2(1) and 2(3) may be performed repetitively, i.e., separately in several times, as shown in FIG. 5. In FIG. 2, solid arrows show discharging paths caused when the discharging of the battery cells 2(2) and 2(4) are performed by turning on the discharging switches 10(2) and 10(4), which are on even-numbered stages (even-numbered lines). In FIG. 3, solid arrows show discharging paths caused when the discharging of the battery cells 2(1) and 2(3) are performed by turning on the discharging switches 10(1) and 10(3), which are on odd-numbered stages (odd-numbered lines).

Next, an operation of the present reference example will be described. When the discharging switch 10 is turned on, the discharging path of the battery cell 2(1) is formed as follows:

Positive terminal of battery cell 2(1)→discharging resistance element 5N(2)→connection terminal 4N(2)→discharging switch 10(1)→connection terminal 4N(1)→discharging resistance element 5N(1)→negative terminal of battery cell 2(1).

Therefore, charges stored in the capacitor 7 of the RC filter 8 are not discharged.

Figure 6:
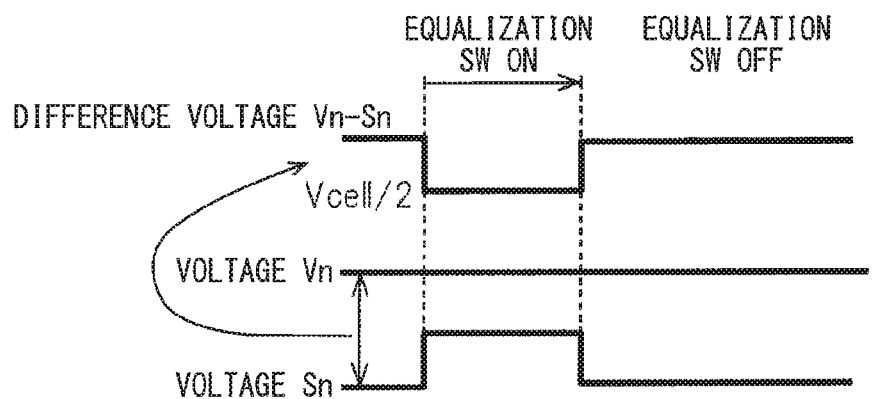
FIG. 6 is a diagram illustrating a time chart showing a change in a differential voltage Vn−Sn in accordance with ON and OFF of a discharging switch.

Assumed that the voltage of the filter connection terminal 9 is defined as Vn, and the voltage of the corresponding connection terminal 4N is defined as Sn. As shown in FIG. 6, when the discharging switch 10 is turned on, a difference voltage Vn−Sn is reduced to a half of terminal voltage $V_{cell}$ of the battery cell 2. When the discharging switch 10 is turned off, the difference voltage Vn−Sn immediately returns to the terminal voltage $V_{cell}$. Therefore, it is possible to quickly shift to the next processing.

Figure 7:
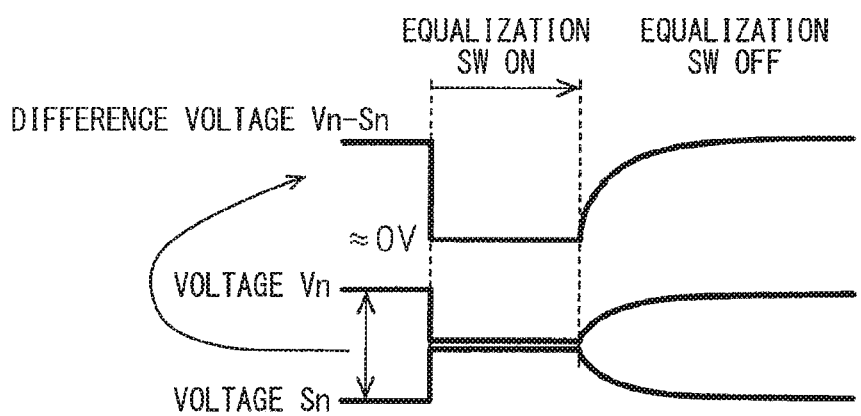
FIG. 7 is a diagram illustrating a time chart showing a change in a differential voltage Vn−Sn in accordance with ON and OFF of a discharging switch in a conventional structure.
Figure 8:
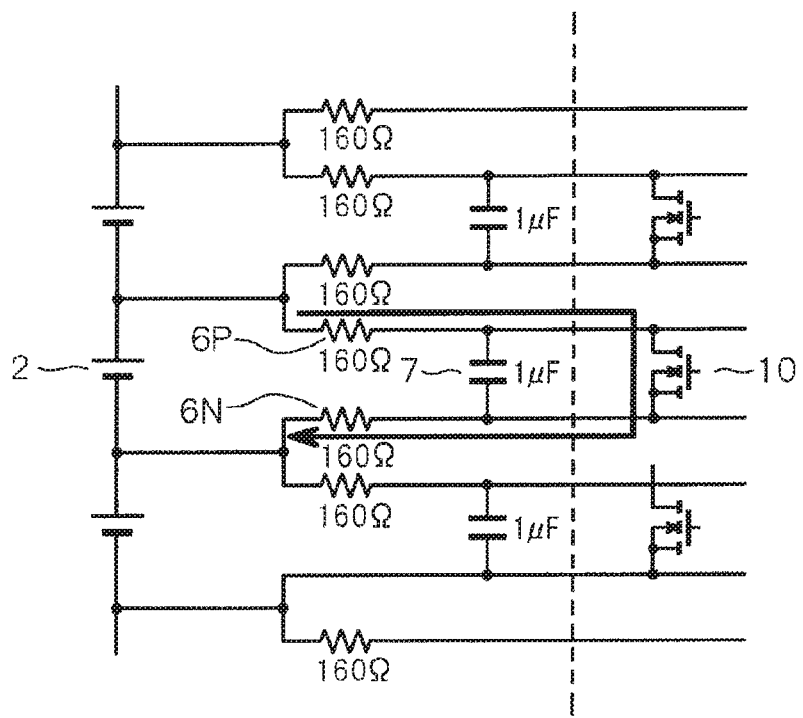
FIG. 8 is a diagram illustrating an example of a conventional structure.

On the other hand, FIG. 8 shows an example of an assembled battery monitoring system of a conventional structure. In the structure of FIG. 8, the resistance element for the filtering is divided into resistance elements 6P and 6N. The resistance element 6P is coupled between the positive terminal of the battery cell 2 and one end of the capacitor 7, and the resistance element 6N is coupled between the negative terminal of the battery cell 2 and the other end of the capacitor 7. The resistance elements 6P and 6N are used also for discharging. In this structure, when the discharging path of the battery cell 2 is formed, the difference voltage Vn−Sn at the time of turning on the discharging switch 10 is reduced to approximately 0 V, as shown in FIG. 7, because the resistance element 6N is disposed on the discharging path through which the charges stored in the capacitor 7 are discharged. Further, in order to return the difference voltage Vn−Sn to the terminal voltage $V_{cell}$ after the discharging switch 10 is turned off, a time period to complete the charging of the capacitor 7 is necessary. Therefore, it is difficult to quickly shift to the next processing.

In the present reference example, as described above, the assembled battery monitoring system includes the discharging resistance elements 5, the RC filters 8, and the discharging switches 10. The discharging resistance elements 5 and the RC filters 8 are correspondingly coupled between the battery cells 2 and the voltage monitoring IC 3. The discharging switches 10 are disposed inside of the voltage monitoring IC 3 and correspondingly to the battery cells 2 for discharging the corresponding battery cells 2. The connection terminals 9 and 4N(−) provided in the voltage monitoring IC 3 are used for monitoring the voltages of the battery cells 2 through the output terminals of the RC filters 8. The connection terminals 4N(+) provided in the voltage monitoring IC 3 are used for forming the discharging paths of the battery cells 2 when the discharging switches 10 are turned ON. On each discharging path, the discharging resistance element 5N is arranged at a position that prohibits discharging of the charges stored in the capacitor 7 of the RC filter 8.

Specifically, the input terminal of the RC filter 8 is coupled to the positive end of the corresponding battery cell 2, and the low-potential terminal of the capacitor 7 is coupled to the negative end of the same corresponding battery cell 2. The discharging resistance element 5N is coupled between the positive end and the negative end of the battery cell 2 and the corresponding connection terminals 4N(+) and 4N(−) of the voltage monitoring IC 3. In this configuration, the discharging path formed when the discharging switch 10 is turned on is in parallel with the RC filter 8 relative to the battery cell 2. Therefore, the charges stored in the capacitor 7 are not discharged. Accordingly, the time required for the discharging processing of the battery cells 2 can be shortened, and the voltage monitoring IC 3 can quickly shift to a next processing.

Second Reference Example

Figure 9:
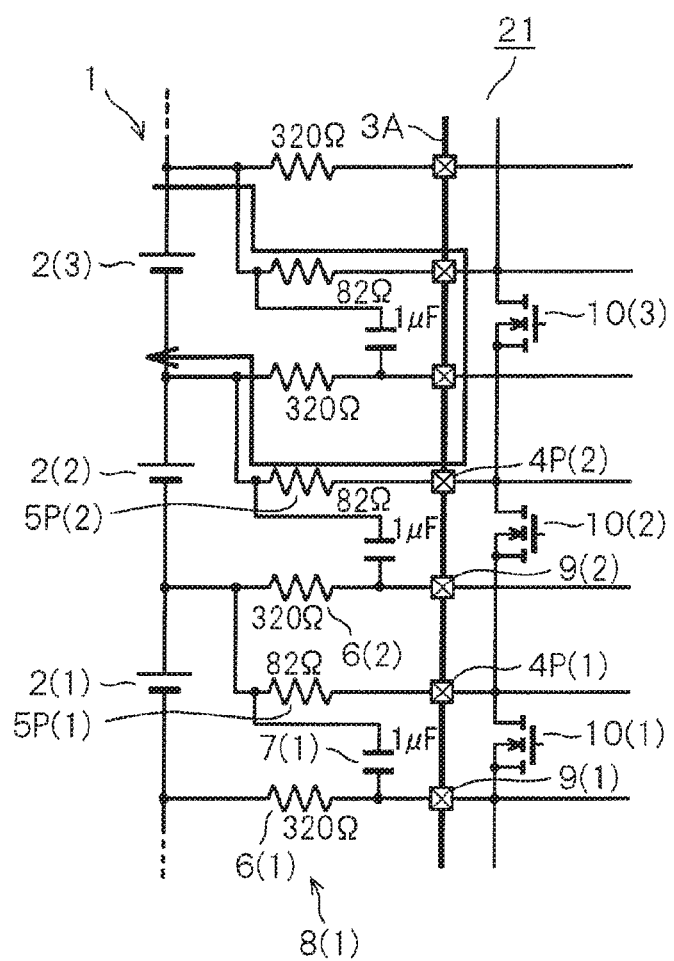
FIG. 9 is a circuit diagram illustrating a part of an assembled battery monitoring system of a second reference example.

Hereinafter, parts same as the first reference example will be designated with the same reference numbers, and descriptions thereof will be omitted. Parts different from the first reference example will be described. In an assembled battery monitoring system 21 of the second reference example, as shown in FIG. 9, a series circuit of the resistance element 6 and the capacitor 7, which provide the RC filter 8, is coupled between a negative terminal and a positive terminal of a corresponding battery cell 2. That is, the series circuit of the resistance element 6 and the capacitor 7 is coupled to the corresponding battery cell 2 in a direction opposite to the first reference example. An output terminal of the RC filter 8 is coupled to a filter connection terminal 9 that corresponds to the connection terminal 4N of the first reference example.

A discharging resistance element 5P that corresponds to the discharging resistance element 5N of the first reference example is coupled between the positive terminal of the corresponding battery cell 2 and a connection terminal 4P that corresponds to the filter connection terminal 9 of the first reference example. A discharging switch 10 is coupled between the connection terminal 4P corresponding to one corresponding battery cell 2 and the connection terminal 4P corresponding to another one corresponding battery cell 2 on a higher stage, inside of the voltage monitoring IC 3A.

Next, an operation of the second reference example will be described. When the discharging switch 10(2) is turned on, a discharging path of the battery cell 2(2) is formed as follows:

Positive terminal of battery cell 2(2)→discharging resistance element 5P(2)→connection terminal 4P(2)→discharging switch 10(2)→connection terminal 4P(1)→discharging resistance element 5P(1)→negative terminal of battery cell 2(2).

Also in this configuration, therefore, charges stored in the capacitor 7 of the RC filter 8 are not discharged.

In the second reference example, as described above, an input terminal of the RC filter 8 is coupled to the negative terminal of the corresponding battery cell 2, and a high-potential terminal of the capacitor 7 is coupled to the positive terminal of the corresponding battery cell 2. Further, the discharging resistance element 5P is coupled between the positive and negative terminals of the battery cell 2 and the corresponding connection terminals 4P(+) and 4P(−) of the voltage monitoring IC 3. Therefore, effects similar to the first reference example can be achieved.

First Embodiment

The first and second reference examples described above are directed to structures in which the discharging resistance element is arranged on the discharging path, and the embodiments of the present disclosure are directed to such structures. In a first embodiment of the present disclosure, a voltage monitoring IC 3 has a function of fault diagnosis, for example, in the structure of the first reference example, and the voltage monitoring IC 3 performs fault determination of each of the discharging switches 10. In the present embodiment, a presence or an absence of a fault of the discharging switch 10 is diagnosed based on a change in voltage of the battery cell 2 when two discharging switches 10, which are apart from each other across two or more discharging switches, are simultaneously turned on.

Note that, hereinafter, the discharging resistance element 5N is referred to as R1 and the resistance element 6 is referred to as R2 for the sake of simplification of explanation. Terminal voltages of five battery cells 2 are referred to as V1 to V5 from the lower potential side, and the discharging switches 10 corresponding to these battery cells 2 are referred to as SW1 to SW5.

Figure 10:
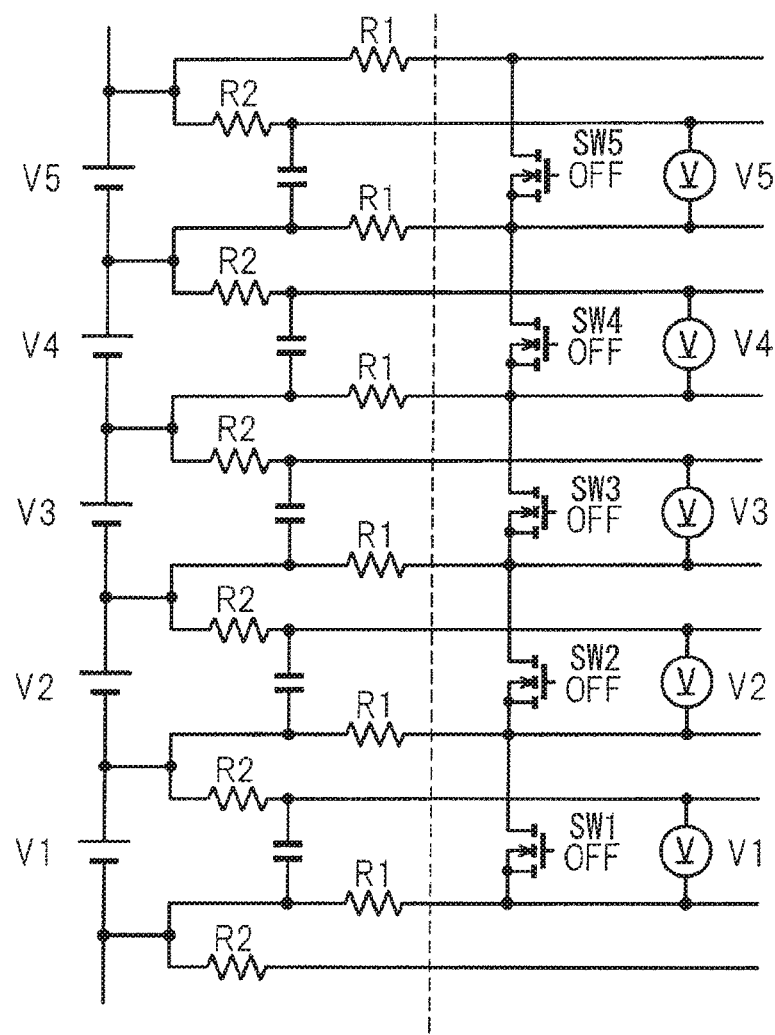
FIG. 10 is a diagram (part 1) for explaining a principle of a fault diagnosis performed by turning on two discharging switches for every three cells in the structure of the first reference example, according to a first embodiment.
Figure 11:
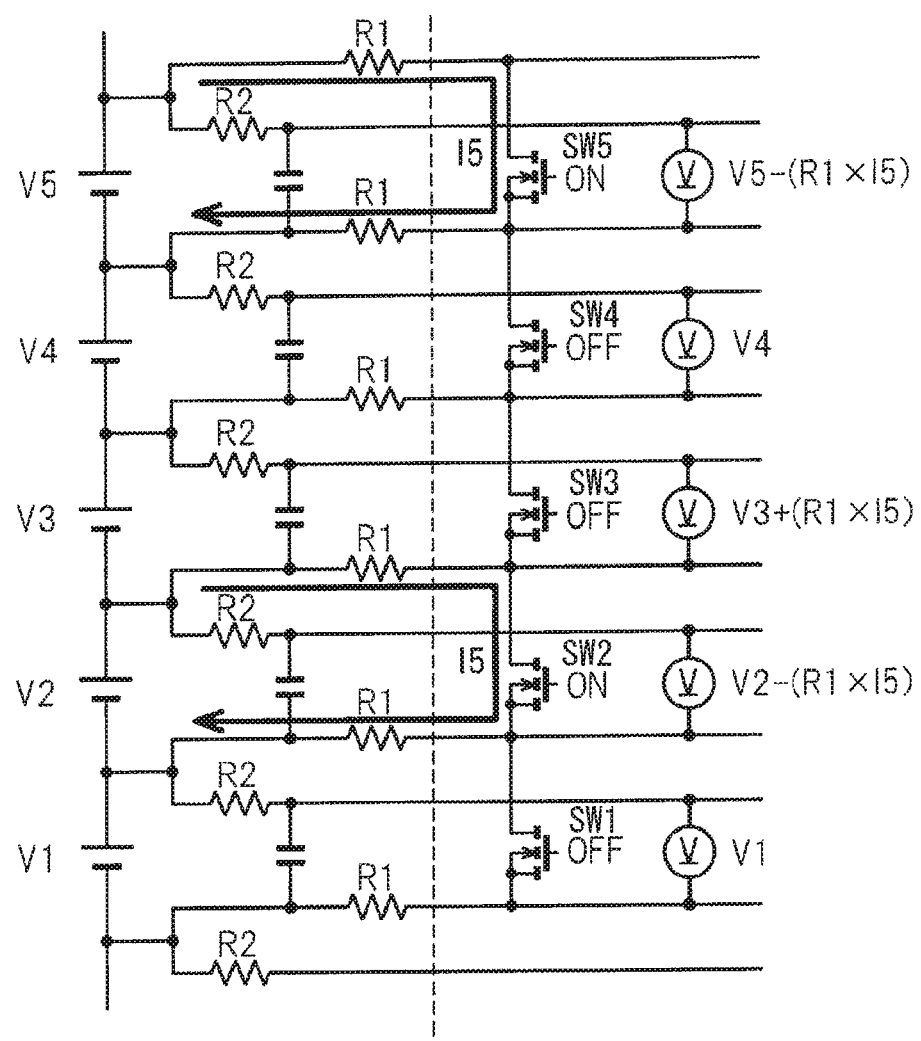
FIG. 11 is a diagram (part 2) for explaining the principle of the fault diagnosis.

As shown in FIG. 10, all the switches SW1 to SW5 are in off states and have no fault, the terminal voltages V1 to V5 of the respective battery cells per se are detected. In this state, when the switch SW2 and the switch SW5 are simultaneously turned on, as shown by solid arrows in FIG. 11, currents I5 flow through the switches SW2 and SW5. Thus, the voltages of the respective battery cells are detected as follows:

V5→V5−R1×I5
V4→V4
V3→V3+R1×I5
V2→V2−R1×I5
V1→V1

In this case, the voltage detected for the battery cell V4 does not change.

Figure 12:
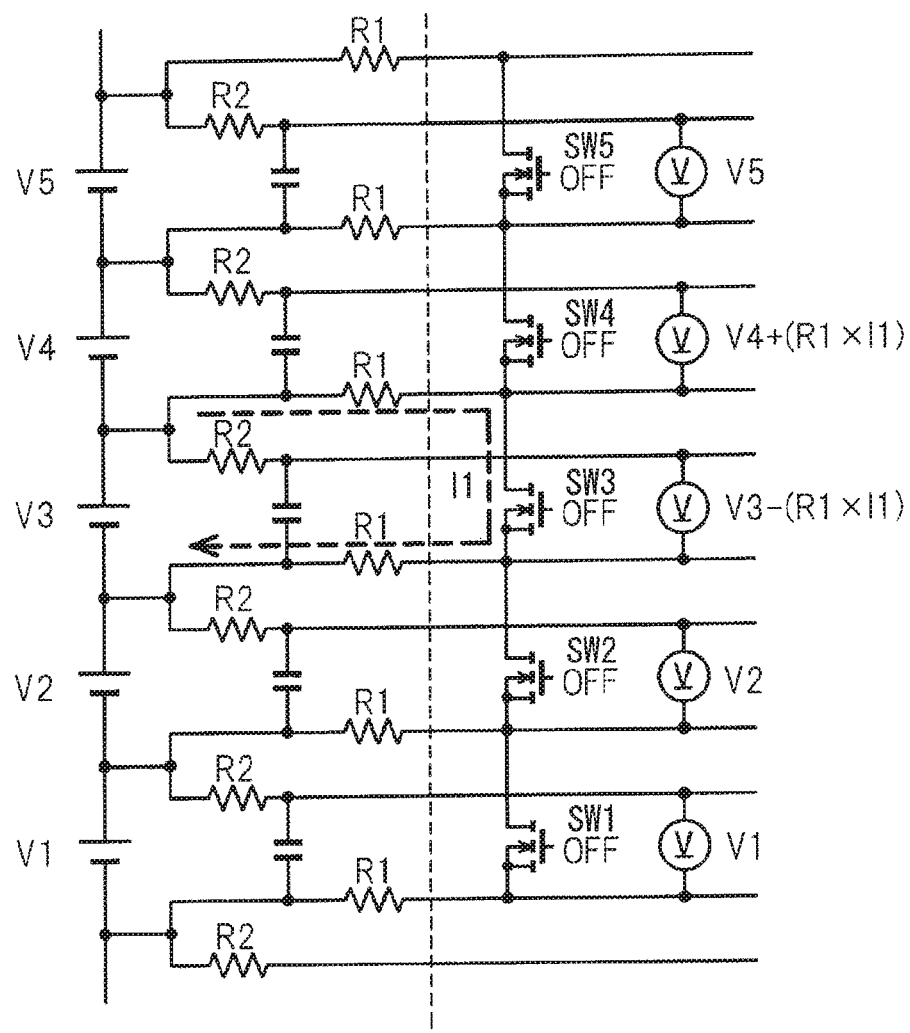
FIG. 12 is a diagram (part 3) for explaining the principle of the fault diagnosis.

On the other hand, as shown in FIG. 12, it is assumed a situation that all the switches SW1 to SW5 are in the off states and a leak current I1 flows in the SW3. In this state, the voltages of the respective battery cells are detected as follows:

V5:V5
V4:V4+R1×I1
V3:V3−R1×I1
V2:V2
V1:V1

Figure 13:
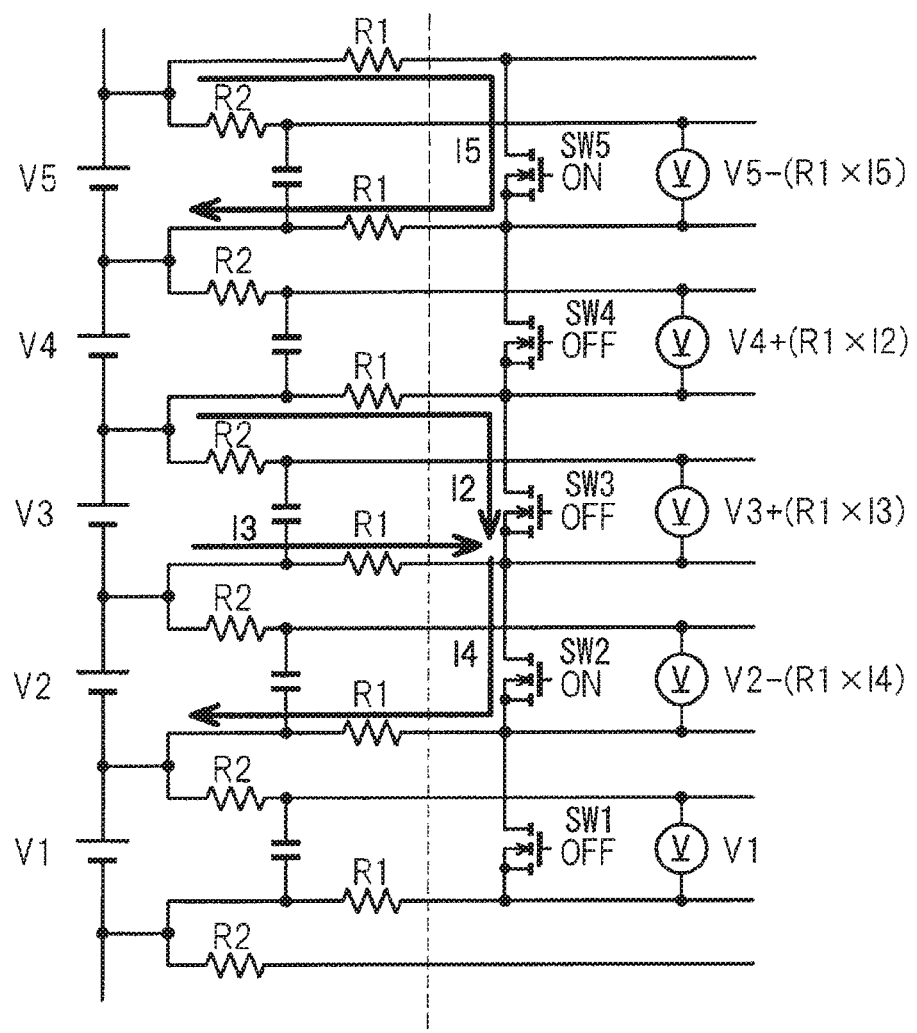
FIG. 13 is a diagram (part 4) for explaining the principle of the fault diagnosis.

In this state, when the switches SW2 and SW5 are simultaneously turned on, as shown in FIG. 13, currents flowing in respective parts change. Therefore, the voltages detected for the battery cells V5 to V1 change as follows. Note that currents flowing via the switch SW2 and SW5 are, respectively, referred to as I4 and I5, and a current flowing from the positive terminal of the batter cell V2 to the resistance element R1 is referred to as I3. In this case, the leak current flowing in the switch SW3 changes to I2, that is, (I4=I2+I3) is established.

V5:V5−R1×I5
V4:V4+R1×I2
V3:V3−R1×I3
V2:V2−R1×I4
V1:V1

In this case, the voltage detected for the battery cell V4 changes in accordance with a change in the leak current flowing in the switch SW3. Based on this change, an occurrence of the current leakage in the battery cell V3 or V4 can be detected.

Figure 14:
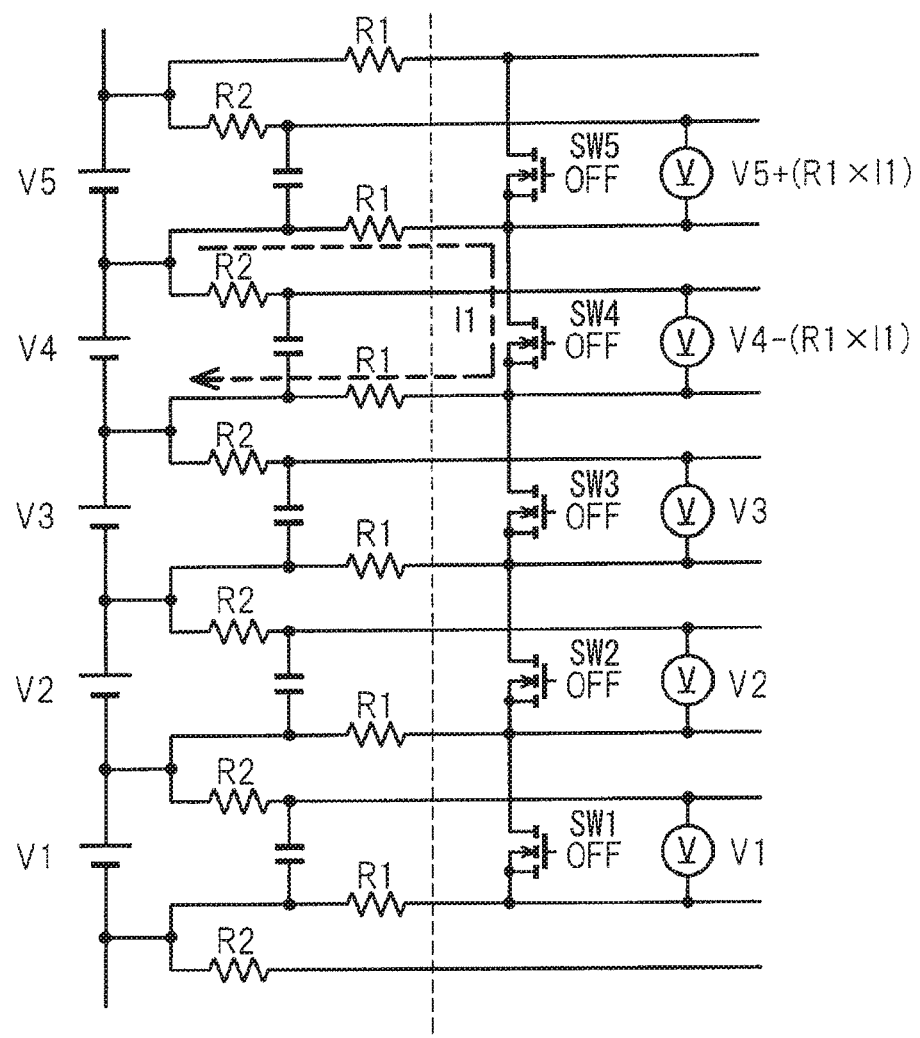
FIG. 14 is a diagram (part 5) for explaining the principle of the fault diagnosis.

As shown in FIG. 14, in a case where all the switches SW1 to SW5 are in the off states and a leak current I1 is flowing in the switch SW4, the voltages for the respective battery cells are detected as follows:

V5:V5+R1×I1
V4:V4−R1×I1
V3:V3
V2:V2
V1:V1

Figure 15:
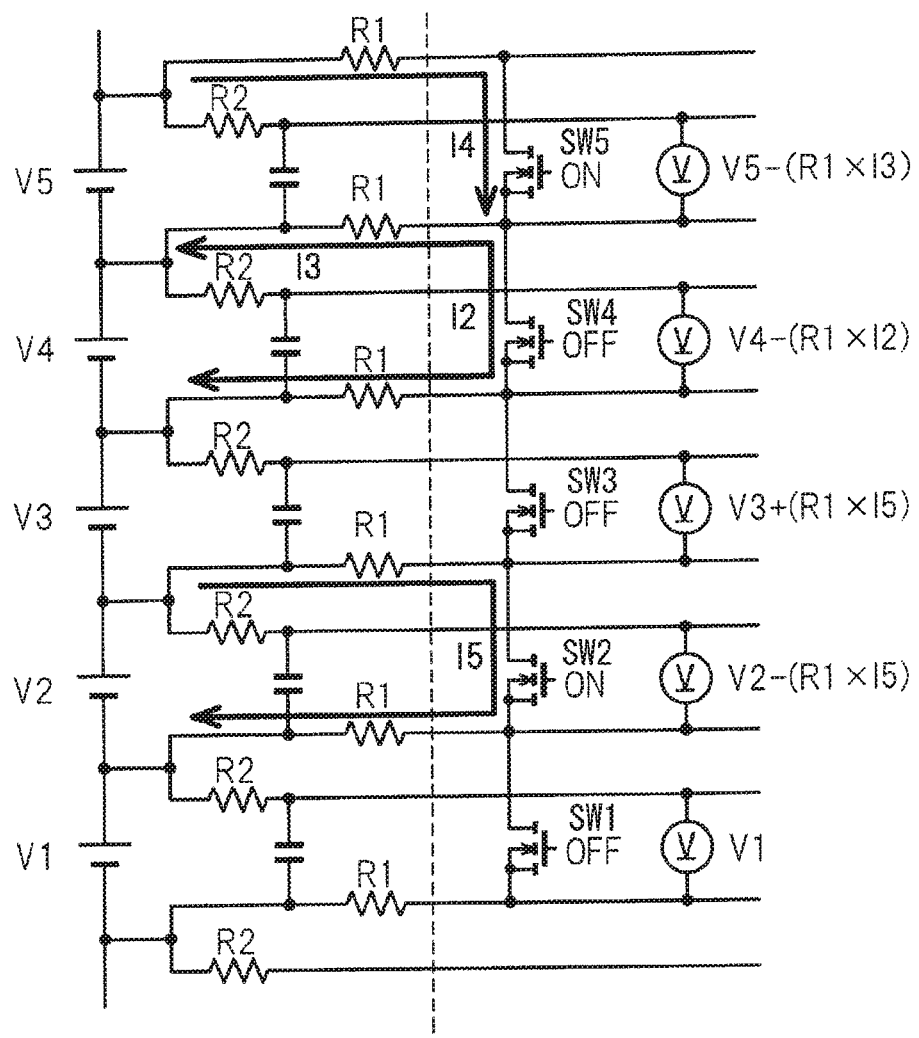
FIG. 15 is a diagram (part 6) for explaining the principle of the fault diagnosis.

In this state, as shown in FIG. 15, when the switch SW2 and the switch SW5 are simultaneously turned on, the voltages detected for the battery cells V5 to V2 change as follows. Note that the currents flowing via the switch SW2 and the switch SW5 are respectively referred to as I5 and I4, and a current flowing from the source of the switch SW5 to the resistance element R1 is referred to as I3. In this case, the leak current I2 flowing in the switch SW4 changes to I2 (I4=I2+I3).

V5: V5−R1×I3
V4: V4−R1×I2
V3: V3+R1×I5
V2: V2−R1×I5
V1: V1

Also in this case, the voltage detected for the battery cell V4 changes in accordance with the change in leak current flowing in the switch SW4. Therefore, it is possible to detect an occurrence of a current leakage in the battery cell V3 or V4. In the case shown in FIG. 13, the voltage of the battery cell V4 is increased. In the case shown in FIG. 15, the voltage of the battery cell V4 is reduced. Depending on the states of these changes, it is possible to discriminate in which cell the current leakage has occurred. In the former case, the cell V3 has the current leakage. In the latter case, the cell V4 has the current leakage.

Figure 16:
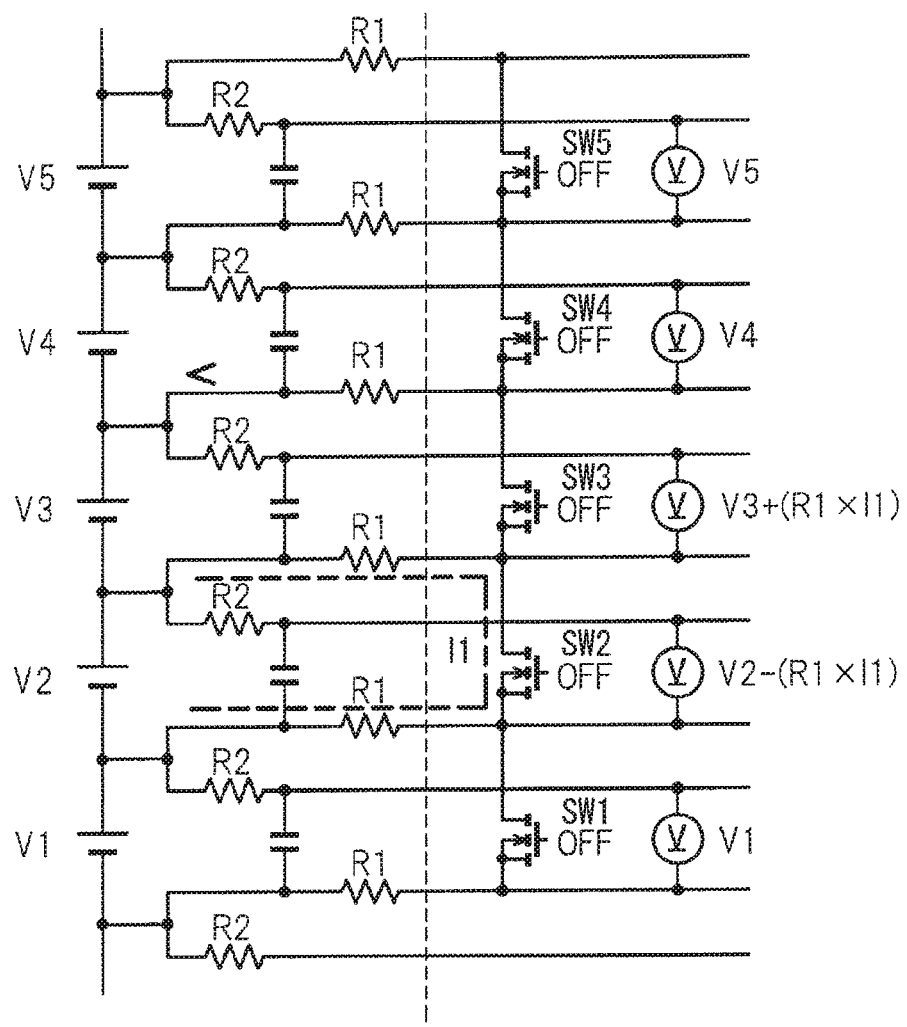
FIG. 16 is a diagram (part 1) for explaining a principle of a fault diagnosis performed by turning on two discharging switches for every four cells.

As shown in FIG. 16, it is assumed a situation where all the switches SW1 to SW5 are in the off state, and the leak current I1 is flowing in the SW2. In this state, the voltages detected for the respective cells are as follows:

V5:V5
V4:V4
V3:V3+R1×I1
V2:V2−R1×I1
V1:V1

Figure 17:
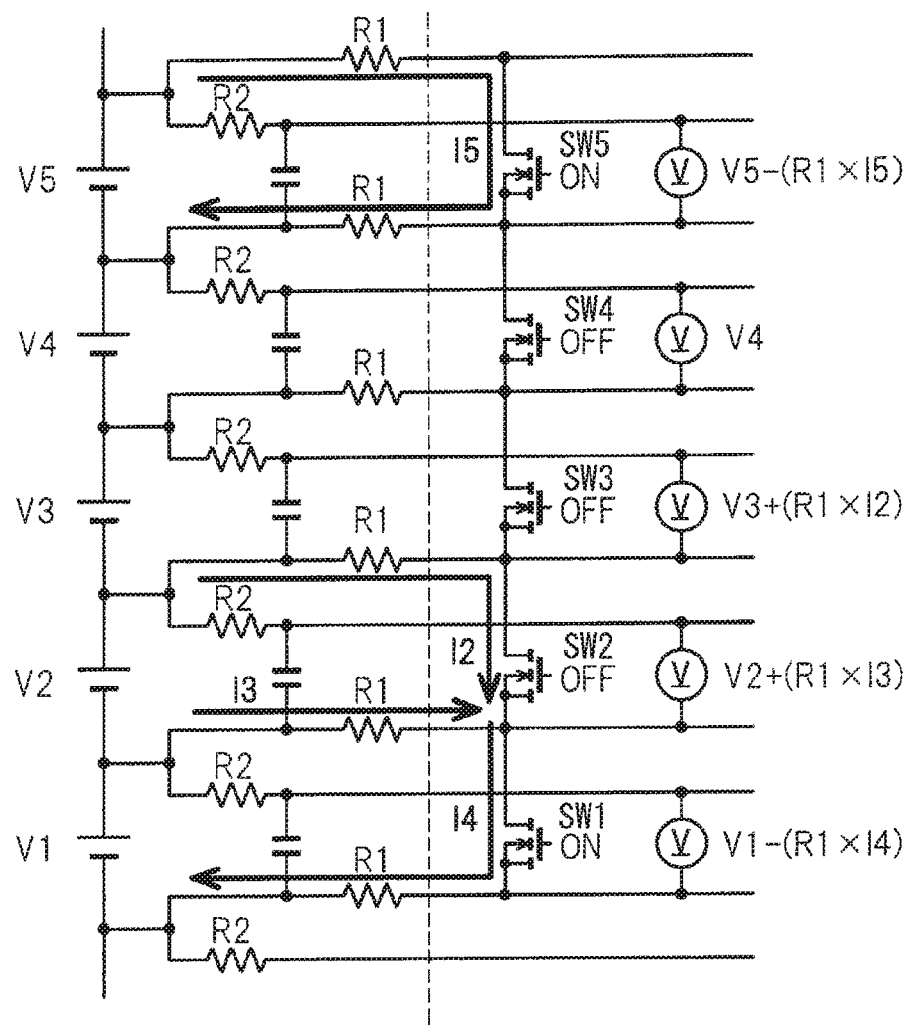
FIG. 17 is a diagram (part 2) for explaining the principle of the fault diagnosis.

In this state, as shown in FIG. 17, when the two discharging switches SW1 and SW5, which are apart from each other across three discharging switches, are simultaneously turned on, the voltages detected for the cells V5 to V1 change as follows: In this case, currents flowing via the SW1 and SW5 are respectively referred to as I4 and I5, and a current flowing from the positive terminal of the cell V1 to the resistance element R1 is referred to as I3, the leak current flowing in the switch SW2 changes to I2.

V5: V5−R1×I5
V4: V4
V3: V3+R1×I2
V2: V2+R1×I3
V1: V1−R1×I4

The voltage detected for the cell V3 changes in accordance with the change in leak current flowing in the switch SW3. Therefore, it is possible to detect an occurrence of current leakage in the cell V3 or V2.

Figure 18:
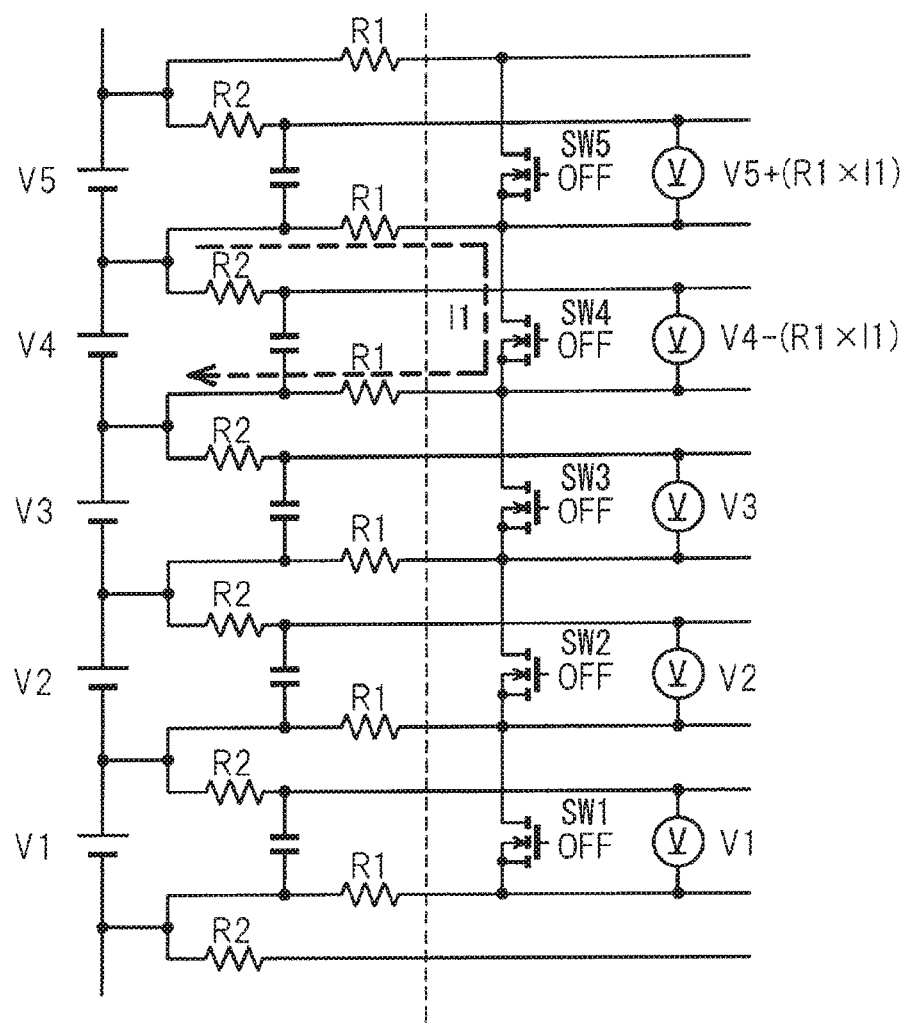
FIG. 18 is a diagram (part 3) for explaining the principle of the fault diagnosis.
Figure 19:
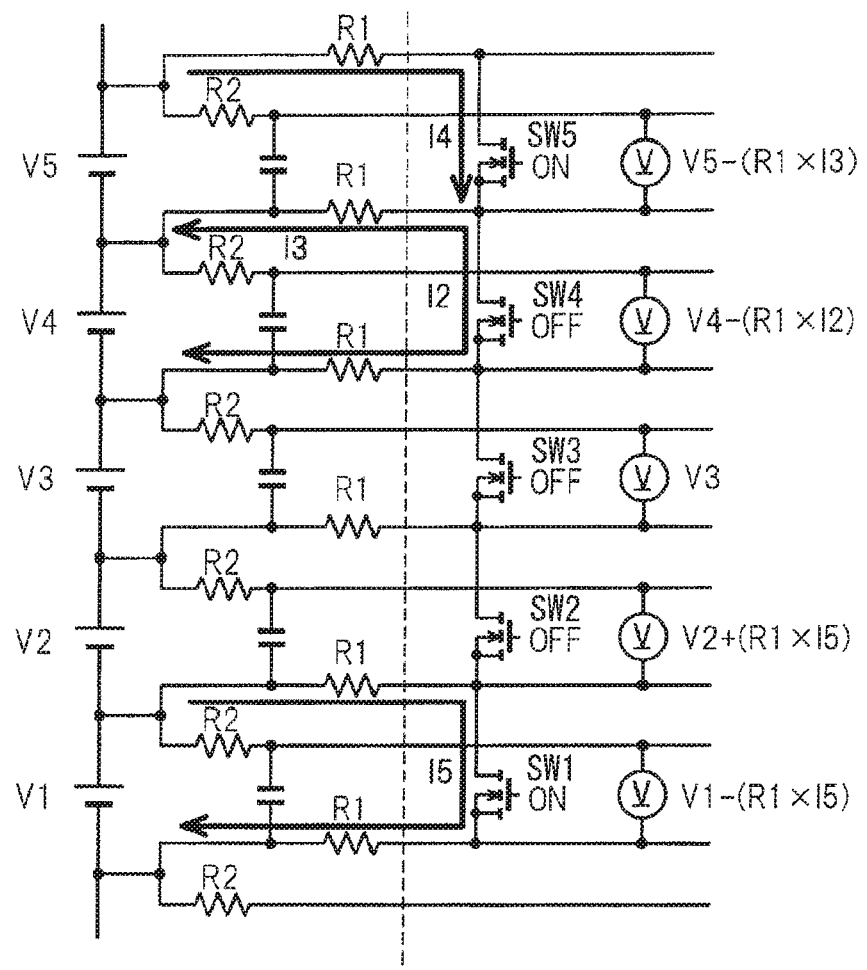
FIG. 19 is a diagram (part 4) for explaining the principle of the fault diagnosis.

Also, as shown in FIG. 18, it is assumed a situation where all the switches SW1 to SW5 are in the off state and the leak current I1 is flowing in the switch SW4. In this situation, the voltages detected for the respective cells are as follows:

V5: V5+R1×I1
V4: V4−R1×I1
V3: V3
V2: V2
V1: V1

In this state, when the two discharging switches SW1 and SW5, which are apart from each other across three discharging switches, are simultaneously turned on, the voltages detected for the cells V5 to V1 change in the following manner. Note that, when currents flowing via the switch SW1 and SW5 are respectively referred to as I5 and I4, and the current flowing from the source of the switch SW5 to the resistance element R1 is referred to as I3, the leak current flowing in the switch SW4 changes to I2.

V5: V5−R1×I3
V4: V4−R1×I2
V3: V3
V2: V2+R1×I5
V1: V1−R1×I5

The voltage detected for the cell V4 changes in accordance with the change in leak current flowing in the switch SW4. Therefore, it is possible to detect an occurrence of current leakage in the cell V4 or V3.

Figure 20:
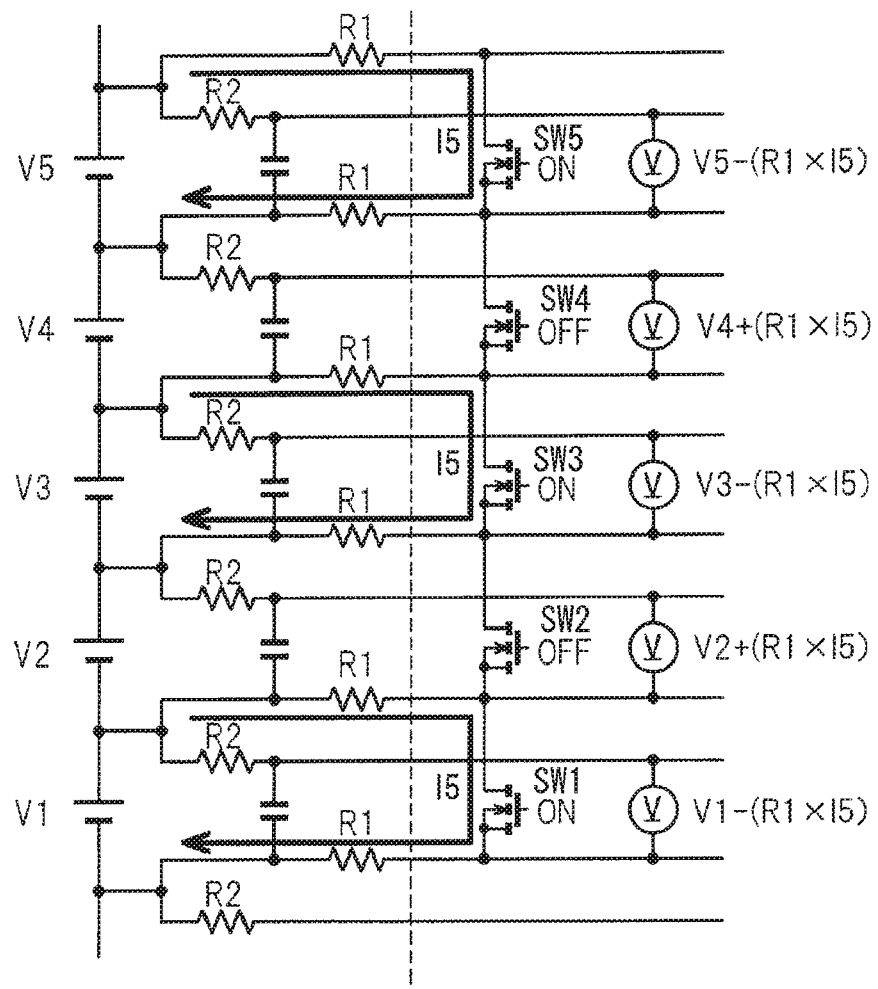
FIG. 20 is a diagram for explaining that a fault diagnosis cannot be performed when two discharging switches are turned on for every two cells.

When every other discharging switches are turned on, as shown in FIG. 20, the voltages detected for all the cells change in the following manner. Therefore, a fault diagnosis cannot be performed.

V5: V5−R1×I5
V4: V4+R1×I5
V3: V3−R1×I5
V2: V2+R1×I5
V1: V1−R1×I5

Next, effects of the present embodiment will be described in regard to an example in which the number of battery cells connected in series in multiple stages is "20". The interval between the two discharging switches to be turned is similar to those of FIGS. 12 to 17, and the discharging switches of every third cells interposing two cells therebetween are turned on. Each of the battery cells is designated with either number of "1 to 20" in an incrementing order from the low potential side to the high potential side.

Figure 21:
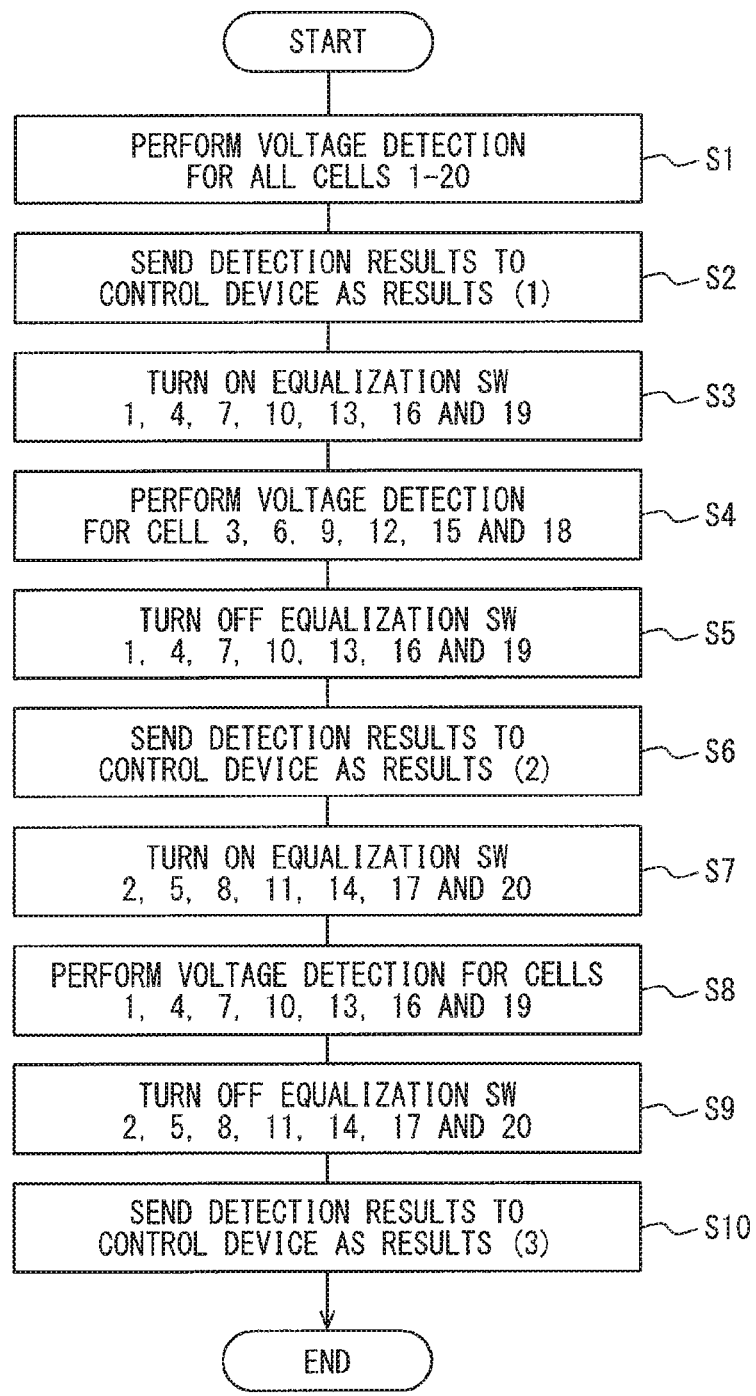
FIG. 21 is a diagram illustrating a flowchart of a voltage detection processing performed by a control device and a voltage detection device.

As shown in FIG. 21, the control device 11 controls on and off of the switches 13 and 14 in the state where all the discharging switches are in the off states, and allows the voltage detection device 12 to independently detect the voltage of each of battery cells 1 to 20 (S1). The detection results are provided to the control device 11 (S2). The detection results provided at S2 are referred to as results (1).

Next, the control device 11 turns on the discharging switches of every three cells from the cell "1" on the low potential side. That is, the switches SW1, 4, 7, 10, 13, 16, and 19 are turned on (S3), In this state, the voltage of each of the battery cells 3, 6, 9, 12, 15, and 18, which are each located next to and on the low potential side of the higher potential side discharging switch of the respective pair of the discharging switches turned on, is detected (S4). Then, the discharging switches turned on at the step S3 are turned off (S5). Further, the detection results at the step S4 are provided to the control device 11 (S6). The detection results provided at the step S4 are referred to as results (2).

Next, the control device 11 turns on the discharging switches of every three cells, which are next to the discharging switches turned on at the step S3 on the high potential side. Namely, the witches 2, 5, 8, 11, 14, 17, and 20 are turned on (S7). In this state, the voltage of each of the cells 1, 4, 7, 10, 13, 16, and 19, which are each located next to and on the lower potential side than the higher potential side discharging switch of the respective pair of the discharging switches turned on, is detected (S8). Then, the discharging switches, which are turned on at the step S7, are turned off (S9). Next, the detection results of the step S8 are provided to the control device 11 (S10). The detection results provided at S10 are referred to as results (3).

In regard to the time required to measure the terminal voltages of the cells by turning on the two discharging switches for performing a fault diagnose, it is preferably set shorter than the time constant of the RC filter 8 to make the effects of the RC filter 8 useful. For example, as the first reference example, which is the base of the present embodiment, when R=320Ω and C=1 μF are satisfied, cutoff frequency of the RC filter 8 is approximately 500 Hz. In this case, the measurement time is 2 ms or less. In the above constant, when the resistance value is changed as to R=3200Ω, the cutoff frequency is approximately 50 Hz. In this case, the measurement time may be 20 ms or less.

Figure 22:
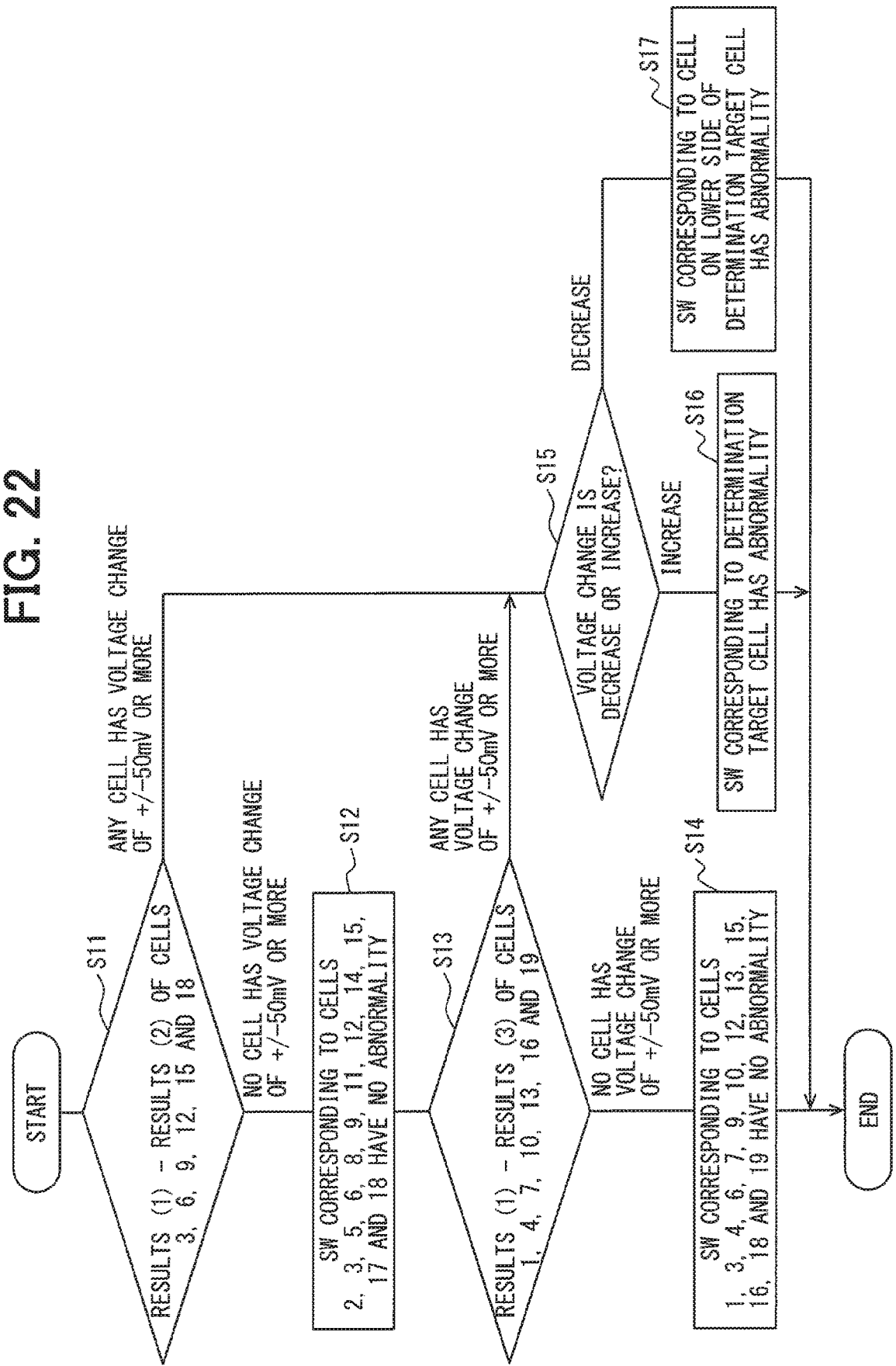
FIG. 22 is a diagram illustrating a flowchart of a determination processing performed by the control device.

As shown in FIG. 22, the control device 11 compares the results (2) and the results (1) in regard to the battery cells that are detection targets in the results (2). It is assumed that the battery cells are, for example, lithium ion cells having terminal voltages of approximately 4V in normal states. It is determined whether the change in voltage is +/−50 mV or more between the result (1) and the result (2) for each of the cells (S11), When the change in voltage of the target cell is less than +/−50 mV, it is determined that each of the cells 2, 3, 5, 6, 8, 9, 11, 12, 14, 15, 17 and 18, which are each on the lower potential side of the target cell by one or two stages, has no abnormality (S12).

Next, the control device 11 compares the results (3) and the results (1) in regard to the battery cells that are detection targets in the results (3). Similarly to the above, it is determined whether the change in voltage is +/−50 mV or more between the result (1) and the result (3) for each of the cells (S13). When the change in voltage of the target cell is less than +/−50 mV, it is determined that each of the cells 1, 3, 4, 6, 7, 9, 10, 12, 13, 15, 16, 18 and 19, which are each on the lower potential side of the target cells by one stage, has no abnormality (S14). Then, the processing is ended.

In regard to the above-described "cell 1", if the corresponding switch SW1 has a current leakage, the current flowing in the negative terminal of the cell 1 changes when the switch SW2 is turned on. Therefore, the abnormality in the switch can be determined by detecting the presence or absence of the voltage change in the cell 1.

In the S11 or in the S13, any of the detection results of the cells of the determination targets indicates the voltage change of +/−50 mV or more, it is determined whether the voltage change is the increase or the decrease (S15). When the voltage change is the "increase", it is determined that the discharging switch corresponding to the cell of the determination target in the S11 or the S13 has the abnormality (S16), When the voltage change is the "decrease", it is determined that the discharging switch that is on the lower potential side by one stage than the cell of the determination target has the abnormality (S17).

In the present embodiment, as described above, the control device 11 simultaneously turns on two discharging switches that are apart from each other across two or more discharging switches. When the terminal voltage of the battery cells 2 that are between the two discharging switches turned on changes over a predetermined voltage relative to the terminal voltage of when the two discharging switches are in off states, it is determined that there is a fault in the discharging switches 10 that are between the two discharging switches simultaneously turned on. In this case, the fault is determined by comparing the terminal voltages of each of the battery cells 2, before and after the corresponding discharging switch is turned on, the battery cells 2 each being located on the lower-potential side by one stage from the higher potential side discharging switch of the two discharging switches simultaneously turned on.

As such, the fault can be determined by referring the voltage change of the battery cells 2 when the existing discharging switches 10 are turned on, without requiring an additional circuit element. In a case where the number of the discharging switches 10 located between the two discharging switches 10 simultaneously turned on is "three", the fault diagnosis can be efficiently performed.

When the change of the terminal voltage over the predetermined voltage is the increase in voltage, it is determined that the discharging switch 10 corresponding to the battery cell 2 indicating the voltage change has a fault. When the change of the terminal voltage over the predetermined voltage is the decrease in voltage, it is determined that the discharging switch that is located on the lower-potential side by one stage than the battery cell 2 indicating the voltage change has a fault. Therefore, it is possible to determine which of two discharging switches has a fault.

In addition, when the two discharging switches 10 are turned on, the control device 11 performs the measurement of the terminal voltages in a time shorter than the time constant of the RC filter 8. Therefore, the fault diagnosis can be performed in the state where the effect of the RC filter 8 is effective. In a case where the control device 11 is provided with the function as a fault diagnosis unit, the equalization processing and the fault diagnosing processing can be performed in the structure of the first reference example without increasing the size of the circuit.

Second Embodiment

Figure 23:
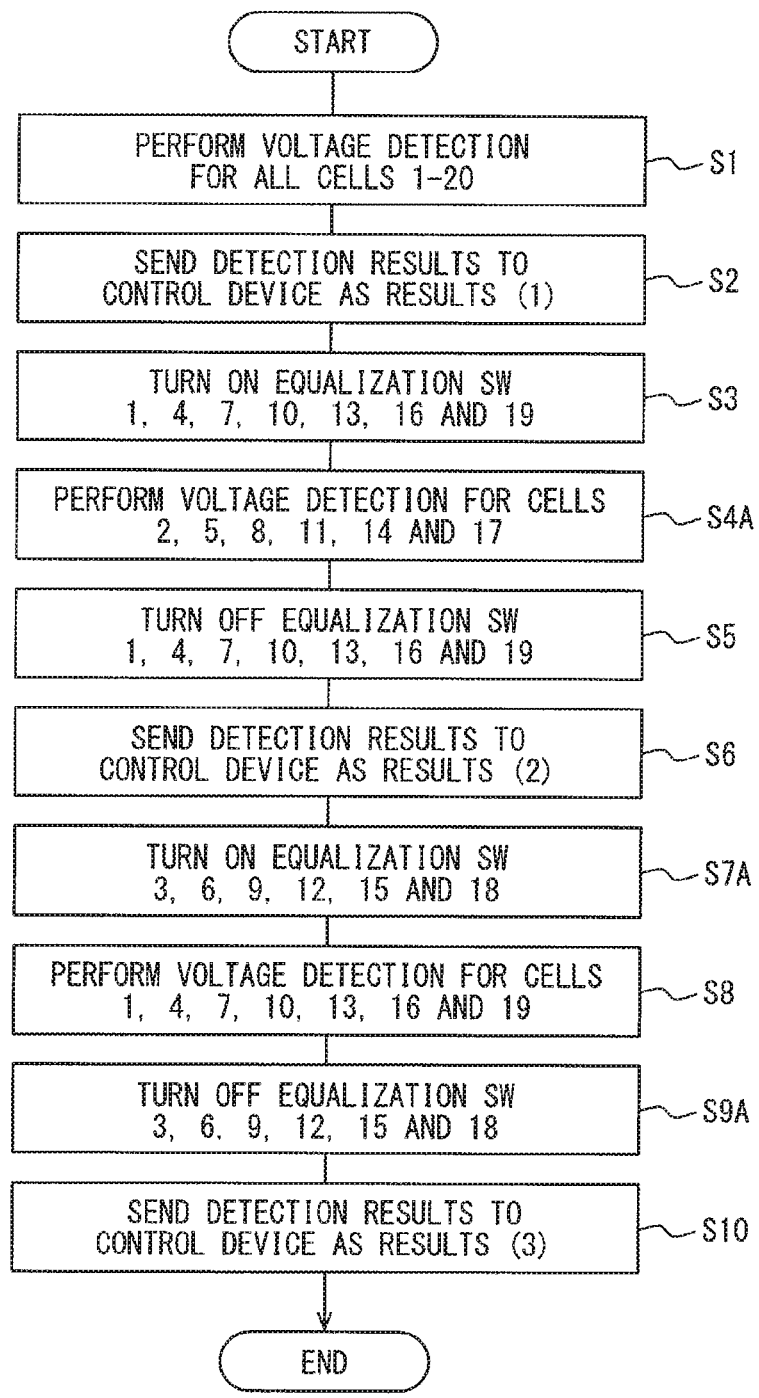
FIG. 23 is a diagram illustrating a flowchart of a voltage detection processing performed by a control device and a voltage detection device in the structure of the second reference example, according to a second embodiment.

In a second embodiment, a fault diagnosis processing for the structure of the second reference example will be described. In this case, as shown in FIG. 23, the battery cells as the voltage detection targets to make the result (2) in S4A are different from those of the first embodiment. In this case, the voltages are detected on the battery cells 2, 5, 8, 11, 14, and 17, which are each located on the lower-potential side by two stages from the higher-potential side discharging switches of the respective pair of the discharging switches simultaneously turned on.

Figure 24:
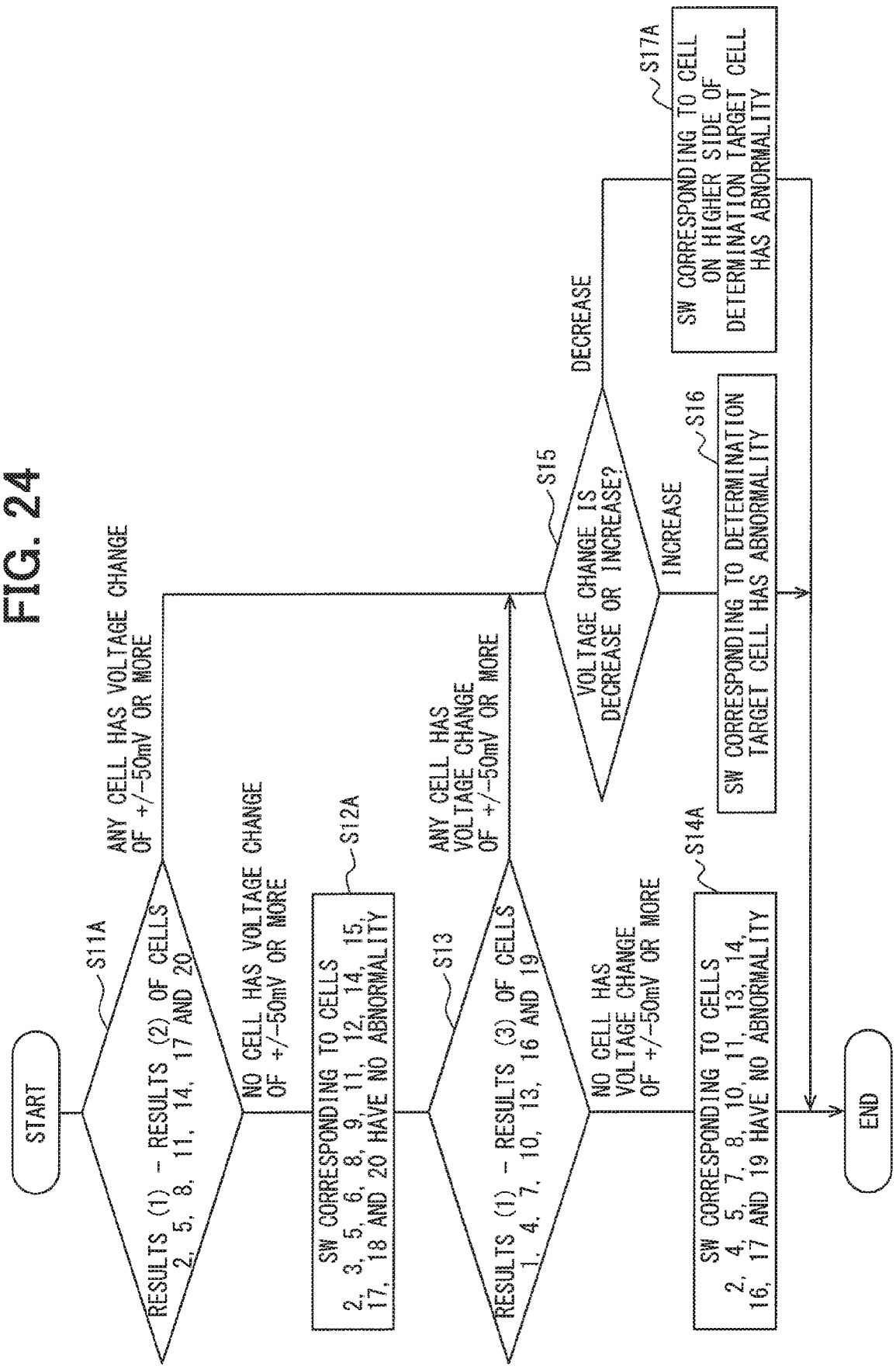
FIG. 24 is a diagram illustrating a flowchart of a determination processing performed by the control device.

Further, the pair of two discharging switches turned on and off on the second time at S7A and S9A in order to obtain the results (3) is different from that of the first embodiment. In this case, the discharging switches SW3, 6, 9, 12, 15, and 18 are turned on and off. As such, the cells used to compare the voltages in S11A are different from those in the first embodiment, as shown in FIG. 24. In addition, in S12A, the "cell 20" is added to the cells that are determined as "having no abnormality".

Figure 25:
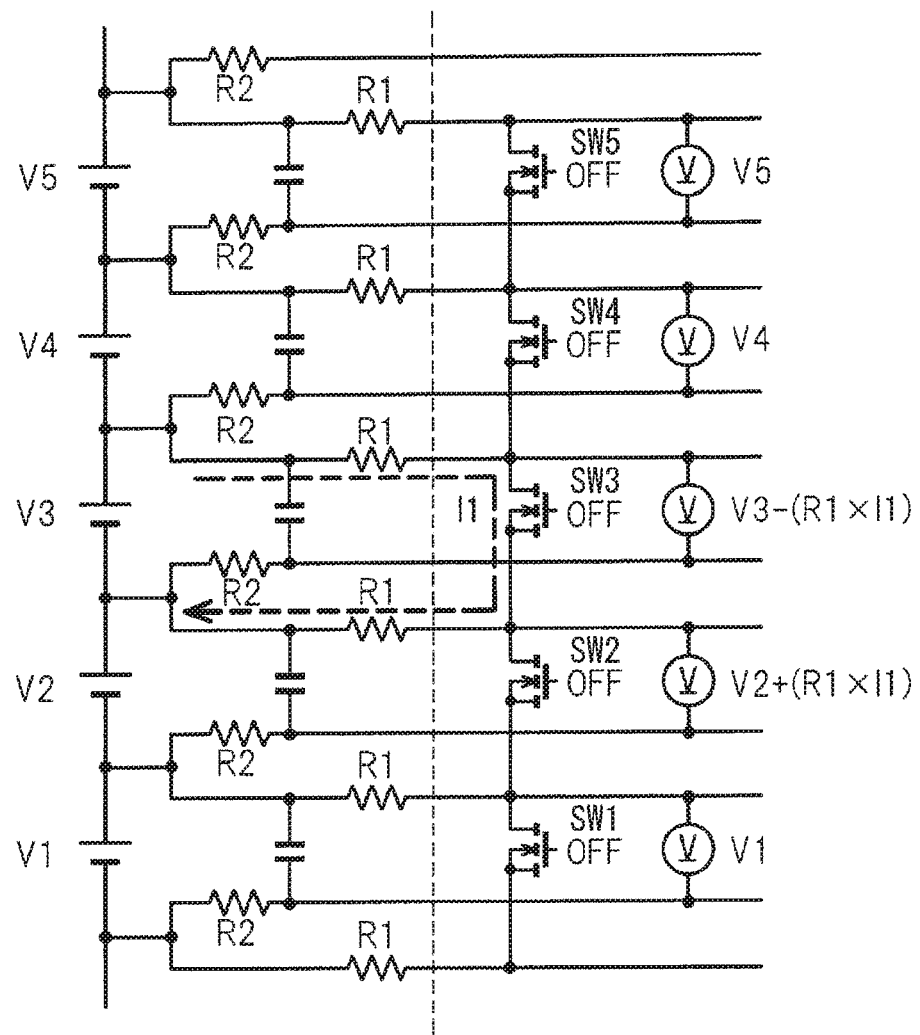
FIG. 25 is a diagram (part 1) for explaining a principle of a fault diagnosis.
Figure 26:
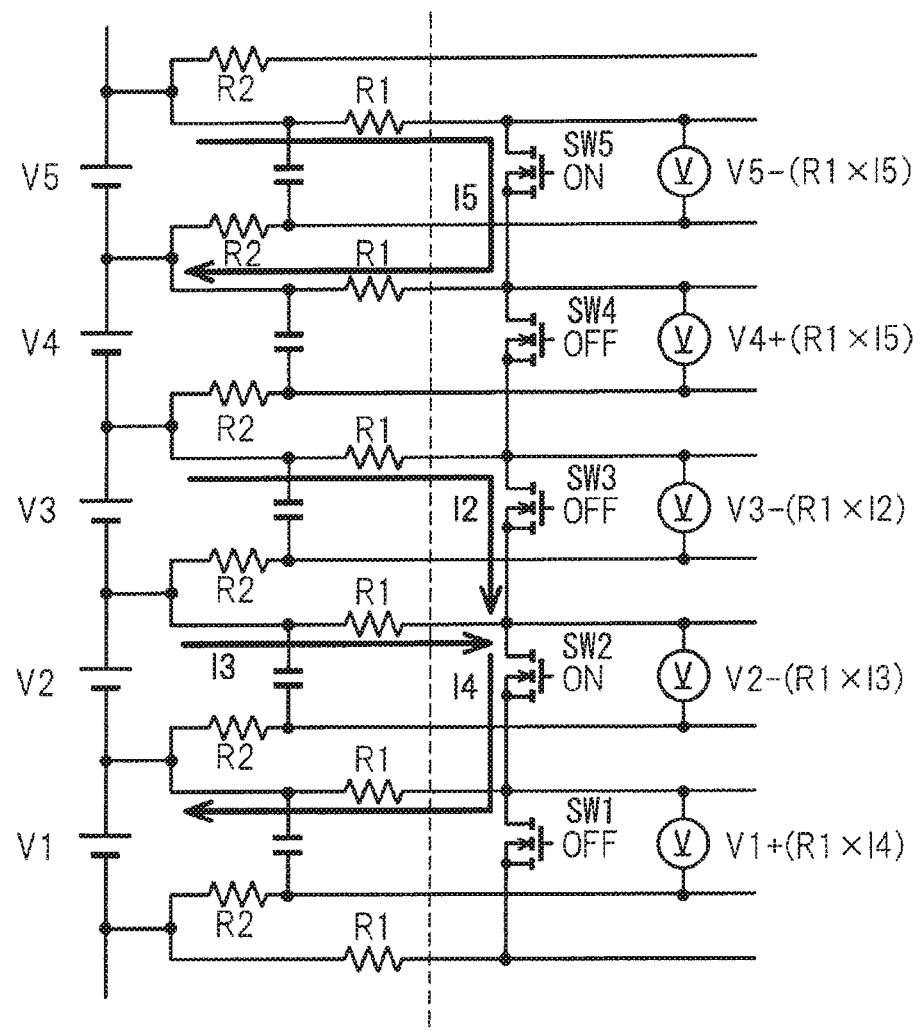
FIG. 26 is a diagram (part 2) for explaining the principle of the fault diagnosis.

For example, as shown in FIG. 25, it is assumed that all the switches SW1 to SW5 are in the off states and the leak current I1 is flowing in the SW3. In this state, the voltages are detected for the respective cells as follows:
V5: V5
V4: V4
V3: V3−R1×I1
V2: V2+R1×I1
V1: V1

In this state, when the switches SW2 and SW5 are simultaneously turned on, the voltages detected for the cells V1 to V5 change in the following manner. Note that the currents flowing via the switches SW2 and SW5 are respectively referred to as currents I4 and I5, and the current flowing from the positive terminal of the cell V2 to the resistance element R1 is referred to as the current I3. In this case, the leak current flowing in the switch SW3 changes to current I2.
V5: V5−R1×I5
V4: V4+R1×I5
V3: V3−R1×I2
V2: V2−R1×I3
V1: V1+R1×I4

In this case, the voltage detected for the cell V3 changes in accordance with the change in the leak current flowing in the switch SW3. Based on this change, it is possible to detect an occurrence of the current leakage in the cell V3 or the cell V4.

In S15 of FIG. 24, when the voltage change is "decrease", it is determined that the discharging switch that corresponds to the cell on the higher-potential side by one stage than the determination target cell has an abnormality (S17A). In S13, when the comparison results of all the target cells indicate voltage change less than +/−50 mV, it is determined that the determination target cells and the cells that are on the higher-potential side by one stage than the determination target cells, that is, the cells 2, 4, 5, 7, 8, 10, 11, 13, 14, 16, 17, and 19 have "no abnormality" (S14A).

In the second embodiment, as described above, the control device 1 determines the fault by comparing the terminal voltages of each of the battery cells 2, which are located on the lower-potential side by two stages than one of the two discharging switches 10 simultaneously turned on, the one being on the higher-potential side than the other. Therefore, in the structure of the second reference example, the fault diagnosis similar to the first embodiment can be performed.

In this case, when the change in the terminal voltage of the battery cells 2 over the predetermined voltage is the increase in voltage, it is determined that the discharging switch 10 corresponding to the cell whose detection voltage has the change has a fault. When the voltage change is the decrease, it is determined that the discharging switch that is located on the higher-potential side by one stage than the battery cell 2 has a fault. Also in this case, therefore, it is possible to specify which of the two discharging switches has the fault.

Third Reference Example

Figure 27:
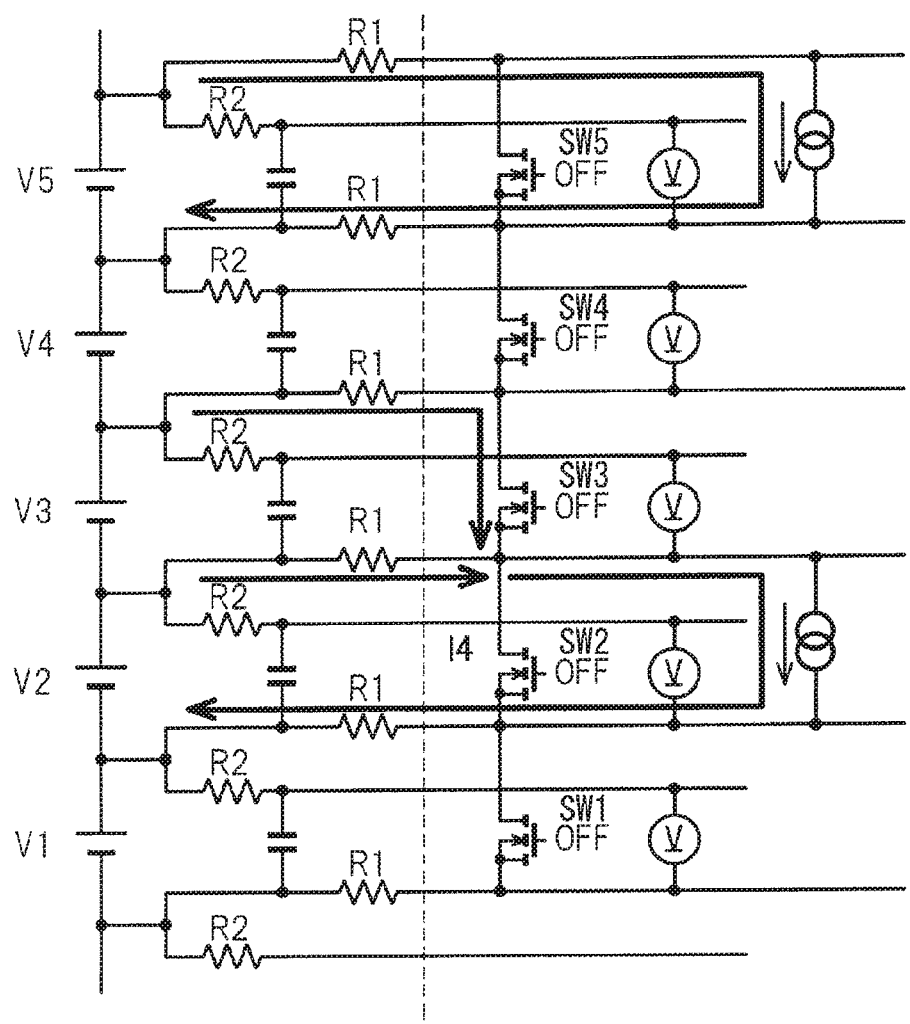
FIG. 27 is a diagram illustrating a third reference example.

In FIG. 27, as a third reference example, current sources are separately connected in parallel with the respective discharging switches. In this case, operations of the current sources are controlled, in place of controlling on and off of the existing discharging switches. Also in this case, fault diagnosis can be performed similarly to the first embodiment. In this structure, however, since the current sources are additionally provided, the structure necessarily results in redundant.

Other Embodiments

The battery cells 2 are not limited to the lithium cells.

An inductor may be inserted between the positive terminal of each battery cell 2 and the corresponding RC filter 8 or the like. A Zener diode or a smoothing capacitor may be coupled in parallel to the battery cell 2.

The time constant of the RC filter, the resistance value of the discharging resistance element, the threshold voltage for abnormality determination may be suitably changed depending on individual design.

The device forming each switch may be provided by any device such as FET, bipolar transistor, or analog switch.

For example, as disclosed in JP 4548501 B2, the present disclosure may be applied to a case where an individual-type RC filter is employed to a structure in which disconnection of the assembled battery is detected using a current source.

It is not always necessary that the part or circuit as the fault diagnosis device is inside of the voltage monitoring IC 3.

In an embodiment, an assembled battery monitoring system includes: a voltage monitoring apparatus 3 configured to monitor a voltage of each of a plurality of battery cells 2 of an assembled battery 1, the plurality of battery cells being coupled in series and in a plurality of stages; a plurality of discharging resistance elements 5 and a plurality of RC filters 8 that are correspondingly coupled between the plurality of battery cells and the voltage monitoring apparatus; a plurality of discharging switches 10 disposed inside of the voltage monitoring apparatus and correspondingly to the plurality of the battery cells, and configured to discharge the corresponding battery cells; and a fault diagnosis device configured to control on and off of each of the discharging switches so as to perform a fault diagnosis of each of the discharging switches. The voltage monitoring apparatus has at least three connection terminals for each of the plurality of battery cells. Two of the at least three connection terminals are configured to be used to monitor a voltage of a corresponding battery cell through an output terminal of a corresponding RC filter. At least one of a remainder of the at least three connection terminals is configured to be used to form a discharging path of the corresponding battery cell when a corresponding discharging switch is turned on. Each of the discharging resistance elements is disposed on the discharging path at a position that prohibits discharging of charges stored in a capacitor of the corresponding RC filter. Further, the fault diagnosis device is configured to simultaneously turn on pairs of two discharging switches, which are apart from each other across at least two discharging switches, and to determine that any of the discharging switches located between any pair of the discharging switches has a fault, when a terminal voltage of any of the battery cells that are located between the pair of the discharging switches has a change over a predetermined voltage relative to the terminal voltage of the battery cell in an off state.

In such an embodiment, the fault of the discharging switches can be determined by monitoring the change in voltage of the battery cells when the existing discharging switches are turned on, without requiring another circuit element.

For example, two discharging switches, which constitutes each pair and are simultaneously turned on, may be apart from each other across three discharging switches.

In an embodiment, each of the RC filters has an input terminal coupled to a positive end of the corresponding battery cell, and the capacitor of each of the RC filters has a low-potential terminal coupled to a negative end of the corresponding battery cell. Each of the discharging resistance elements is coupled between at least one of the positive end and the negative end of the corresponding battery cell and a corresponding connection terminal of the voltage monitoring apparatus. As another embodiment, each of the RC filters has an input terminal coupled to a negative end of the corresponding battery cell, and the capacitor of each of the RC filters has a high-potential terminal coupled to a positive end of the corresponding battery cell. Each of the discharging resistance elements is coupled between at least one of the positive end and the negative end of the corresponding battery cell and a corresponding connection terminal of the voltage monitoring apparatus.

In these configurations, when the discharging switch is turned on, the discharging path is formed in parallel with the battery cell as well as the RC filter. Therefore, the charges stored in the capacitor are not discharged. Accordingly, the time required for the discharging processing of the battery cells is shortened, and the voltage monitoring apparatus can quickly shift to a next processing.

In an embodiment, the fault diagnosis device is configured to determine the fault by comparing the terminal voltage of the battery cell that is located on a lower-potential side of one of the two discharging switches in each pair by one stage, the one of the two discharging switches being on a higher-potential side than the other.

In such a configuration, for example, when the change in voltage of the terminal voltage over the predetermined voltage is an increase in voltage, the fault diagnosis device determines that the discharging switch corresponding to the battery cell indicating the change in voltage has a fault. When the change in voltage of the terminal voltage over the predetermined voltage is a decrease in voltage, the fault diagnosis device determines that the discharging switch that is on a lower-potential side by one stage than the battery cell indicating the change in voltage has a fault.

In an embodiment, the fault diagnosis device is configured to determine the fault by comparing the terminal voltage of the battery cell that is located on a lower-potential side of one of the two discharging switches in each pair by two stages, the one of the two discharging switches being on a higher-potential side than the other.

In such a configuration, for example, when the change in voltage of the terminal voltage over the predetermined voltage is an increase in voltage, the fault diagnosis device determines that the discharging switch corresponding to the battery cell indicating the change in voltage has a fault. When the change in voltage of the terminal voltage over the predetermined voltage is a decrease in voltage, the fault diagnosis device determines that the discharging switch that is on a higher-potential side by one stage than the battery cell indicating the change in voltage has a fault.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An assembled battery monitoring system, comprising:
a voltage monitoring apparatus configured to monitor a voltage of each of a plurality of battery cells of an assembled battery, the plurality of battery cells being coupled in series and in a plurality of stages;
a plurality of discharging resistance elements and a plurality of RC filters that are correspondingly coupled between the plurality of battery cells and the voltage monitoring apparatus;
a plurality of discharging switches disposed inside of the voltage monitoring apparatus and correspondingly coupled to the plurality of the battery cells, each discharge switch configured to discharge a corresponding one of the battery cells; and
a fault diagnosis device configured to control on and off of each of the discharging switches so as to perform a fault diagnosis of each of the discharging switches, wherein
the voltage monitoring apparatus has at least three connection terminals for each of the plurality of battery cells,
two of the at least three connection terminals are configured to be used to monitor a voltage of the corresponding battery cell through an output terminal of the corresponding RC filter,
at least one of a remainder of the at least three connection terminals is configured to be used to form a discharging path of the corresponding battery cell when the corresponding discharging switch is turned on,
a corresponding one of the discharging resistance elements is disposed on the discharging path at a position that prohibits discharging of charges stored in a capacitor of the corresponding RC filter, and
the fault diagnosis device is configured
to simultaneously turn on pairs of two discharging switches, which are apart from each other across at least two discharging switches, and
to determine that any of the discharging switches located between any pair of the discharging switches has a fault, when a terminal voltage of any of the battery cells that are located between the pair of the discharging switches measured when the pairs of two discharging switches are on has a change over a predetermined voltage relative to the terminal voltage of the battery cell measured when the pairs of two discharging switches are off.

2. The assembled battery monitoring system according to claim 1, wherein
two discharging switches, which constitutes each pair and are simultaneously turned on, are apart from each other across three discharging switches.

3. The assembled battery monitoring system according to claim 2, wherein
each of the RC filters has an input terminal coupled to a positive end of the corresponding battery cell,
the capacitor of each of the RC filters has a low-potential terminal coupled to a negative end of the corresponding battery cell,
each of the discharging resistance elements is coupled between at least one of the positive end and the negative end of the corresponding battery cell and a corresponding one of the connection terminals of the voltage monitoring apparatus, and
the fault diagnosis device is configured to determine the fault by comparing the terminal voltage of the battery cell that is located on a lower-potential side of one of the two discharging switches in each pair by one stage, the one of the two discharging switches being on a higher-potential side than the other.

4. The assembled battery monitoring system according to claim 3, wherein
when the change in voltage of the terminal voltage over the predetermined voltage is an increase in voltage, the fault diagnosis device determines that the discharging switch corresponding to the battery cell indicating the change in voltage has a fault, and
when the change in voltage of the terminal voltage over the predetermined voltage is a decrease in voltage, the fault diagnosis device determines that the discharging switch that is on a lower-potential side by one stage than the battery cell indicating the change in voltage has a fault.

5. The assembled battery monitoring system according to claim 2,
wherein each of the RC filters has an input terminal coupled to a negative end of the corresponding battery cell,
the capacitor of each of the RC filters has a high-potential terminal coupled to a positive end of the corresponding battery cell,
each of the discharging resistance elements is coupled between at least one of the positive end and the negative end of the corresponding battery cell and a corresponding one of the connection terminals of the voltage monitoring apparatus, and
the fault diagnosis device is configured to determine the fault by comparing the terminal voltage of the battery cell that is located on a lower-potential side of one of the two discharging switches in each pair by two stages, the one of the two discharging switches being on a higher-potential side than the other.

6. The assembled battery monitoring system according to claim 5, wherein
when the change in voltage of the terminal voltage over the predetermined voltage is an increase in voltage, the fault diagnosis device determines that the discharging switch corresponding to the battery cell indicating the change in voltage has a fault, and
when the change in voltage of the terminal voltage over the predetermined voltage is a decrease in voltage, the fault diagnosis device determines that the discharging switch that is on a higher-potential side by one stage than the battery cell indicating the change in voltage has a fault.

7. The assembled battery monitoring system according to claim 2, wherein each of the discharging switches is coupled between corresponding pairs of the connection terminals of the voltage monitoring apparatus.

8. The assembled battery monitoring system according to claim 1, wherein
the fault diagnosis device is configured to perform measurement of the terminal voltages by turning on the pairs of the discharging switches in a time shorter than a time constant of the corresponding RC filters.

9. The assembled battery monitoring system according to claim 1, wherein
the fault diagnosis device is provided in the voltage monitoring apparatus.

10. An assembled battery monitoring system, comprising:
a voltage monitor configured to be coupled to an assembled battery having a plurality of battery cells coupled in series and in a plurality of stages;
a plurality of discharging resistors and a plurality of RC filters that are correspondingly coupled between the plurality of battery cells and the voltage monitor;
a plurality of discharging switches disposed inside of the voltage monitor and correspondingly coupled to the plurality of the battery cells, each discharge switch configured to discharge a corresponding one of the battery cells; and
a fault diagnosis circuit configured to be coupled to the discharging switches to control on and off of each of the discharging switches so as to perform a fault diagnosis of each of the discharging switches, wherein
the voltage monitor has at least three connection terminals for each of the plurality of battery cells,
two of the at least three connection terminals are configured to be used to monitor a voltage of the corresponding battery cell through an output terminal of the corresponding RC filter,
at least one of a remainder of the at least three connection terminals is configured to be used to form a discharging path of the corresponding battery cell when the corresponding discharging switch is turned on,
a corresponding one of the discharging resistors is disposed on the discharging path at a position that prohibits discharging of charges stored in a capacitor of the corresponding RC filter, and
the fault diagnosis circuit is configured
to simultaneously turn on at least one pair of discharging switches, which are apart from each other across at least two discharging switches, and
to determine that any of the discharging switches located between the at least one pair of the discharging switches has a fault, when a terminal voltage of any of the battery cells that are located between the at least one pair of the discharging switches measured when the at least one pair of the discharging switches is on has a change over a predetermined voltage relative to the terminal voltage of the battery cell measured when the at least one pair of the discharging switches is off.

* * * * *